(12) United States Patent
Ohtsuka

(10) Patent No.: US 8,247,298 B2
(45) Date of Patent: Aug. 21, 2012

(54) METHOD OF MANUFACTURING SEMICONDUCTOR DEVICE

(75) Inventor: Keisuke Ohtsuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/883,752

(22) Filed: Sep. 16, 2010

(65) Prior Publication Data

US 2011/0070720 A1 Mar. 24, 2011

(30) Foreign Application Priority Data

Sep. 18, 2009 (JP) ................................ 2009-217230

(51) Int. Cl.
*H01L 21/336* (2006.01)
(52) U.S. Cl. ............... 438/270; 438/268; 257/E21.384; 257/E21.429
(58) Field of Classification Search ........... 438/270, 438/268, 271; 257/E21.384, E21.429
See application file for complete search history.

(56) References Cited

U.S. PATENT DOCUMENTS

| | | | |
|---|---|---|---|
| 2009/0317954 A1* | 12/2009 | Kim | 438/268 |
| 2010/0013005 A1* | 1/2010 | Roesner et al. | 257/329 |
| 2010/0013009 A1* | 1/2010 | Pan | 257/330 |
| 2010/0190307 A1* | 7/2010 | Lee et al. | 438/270 |
| 2011/0049618 A1* | 3/2011 | Lee et al. | 257/330 |
| 2011/0129975 A1* | 6/2011 | Lee | 438/270 |

FOREIGN PATENT DOCUMENTS

| | | |
|---|---|---|
| JP | 2008-004915 | 1/2008 |
| JP | 2009-010366 | 1/2009 |

\* cited by examiner

*Primary Examiner* — Julia Slutsker
(74) *Attorney, Agent, or Firm* — McDermott Will & Emery LLP

(57) ABSTRACT

Disclosed is a method of manufacturing a semiconductor device comprising: forming a first layer on a sidewall of a trench formed on a main surface of a semiconductor substrate, filling up the trench with a protective film, etching back the protective film by a dry etching method so that a height of a surface of the protective film is lower than an opening of the trench and removing the first layer exposed by the etching-back.

14 Claims, 22 Drawing Sheets

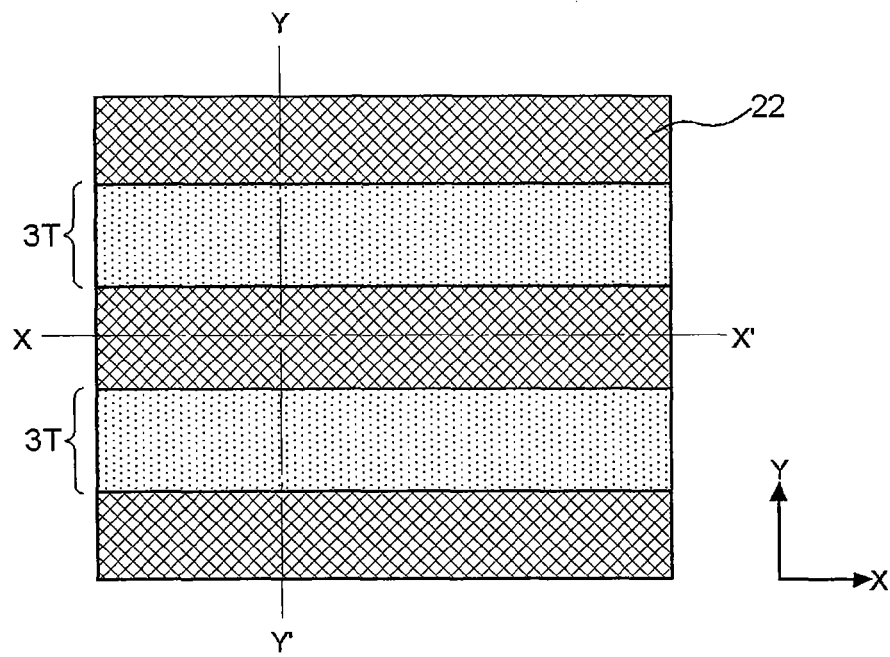
FIG. 3A
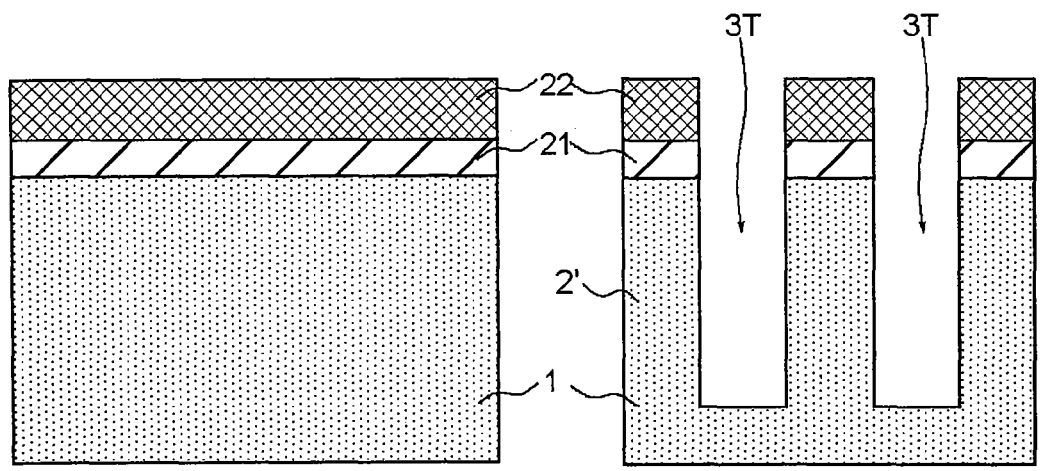
FIG. 3B  FIG. 3C

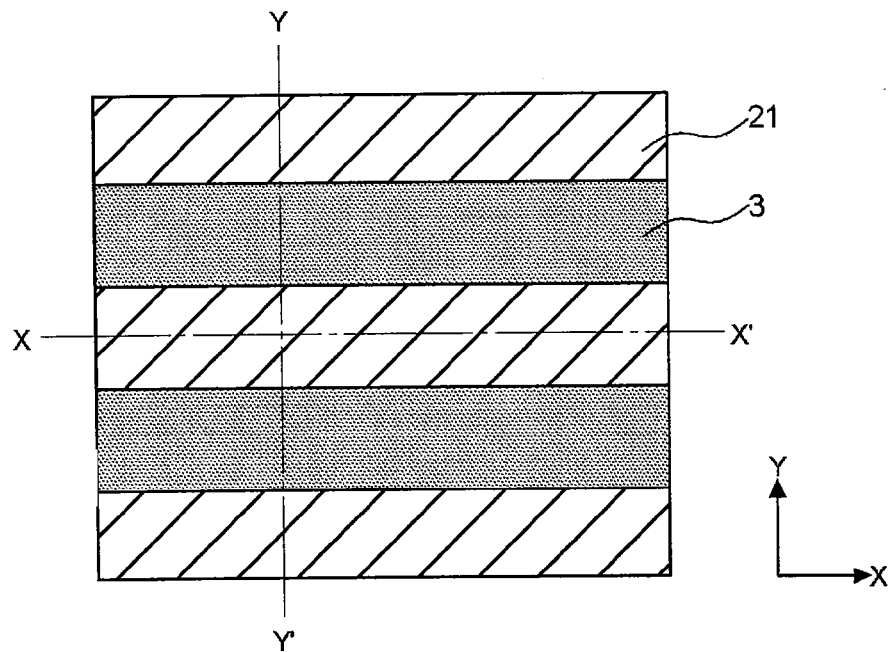
FIG. 4A
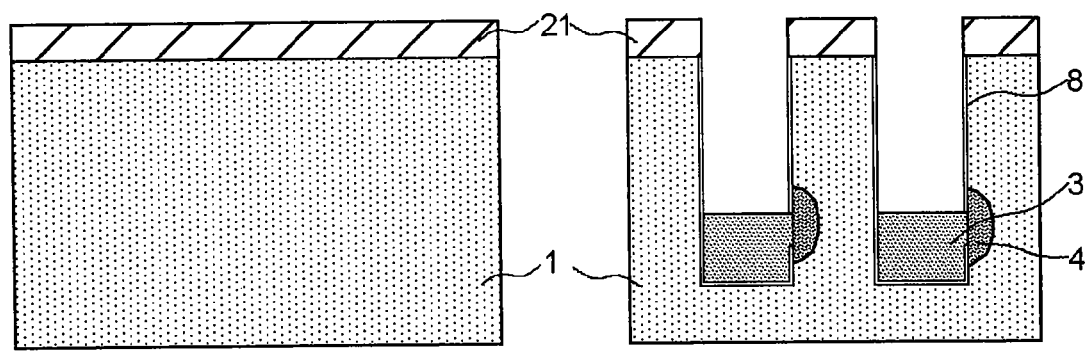
FIG. 4B  FIG. 4C

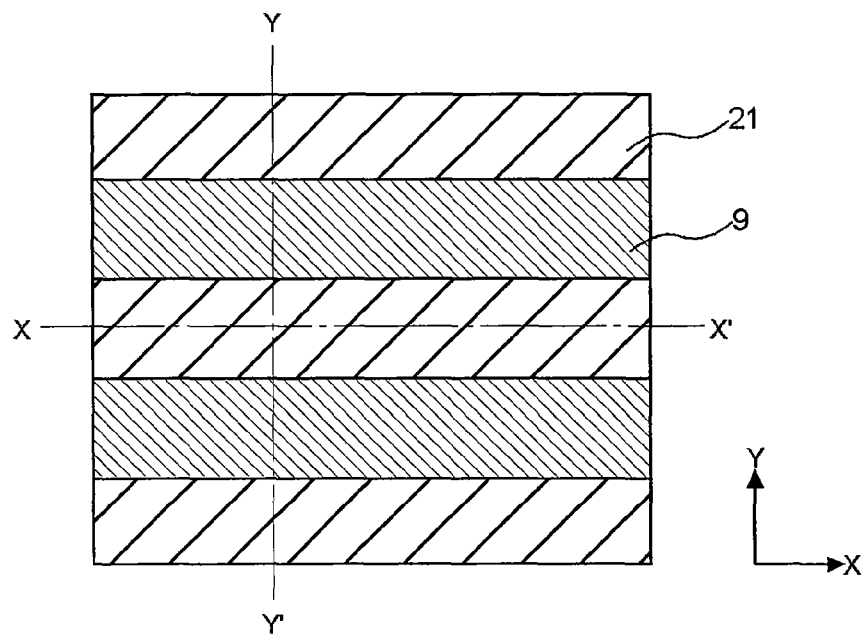
FIG. 5A
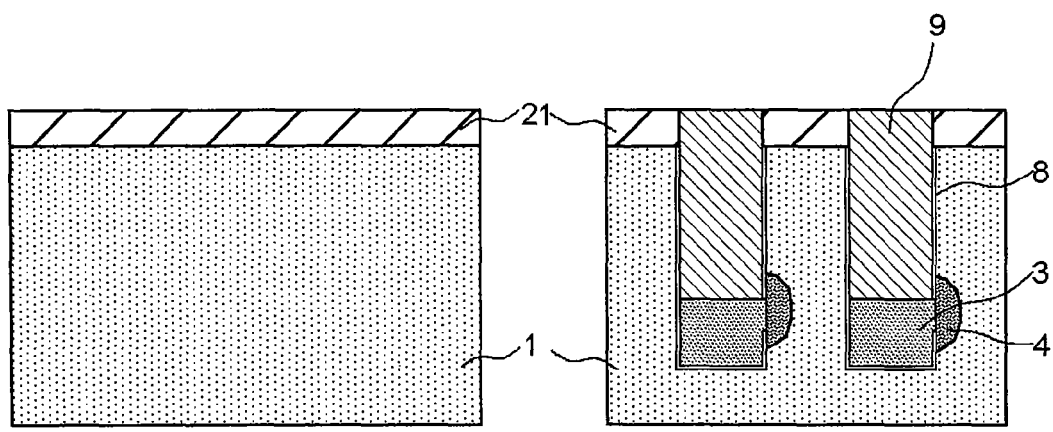
FIG. 5B          FIG. 5C

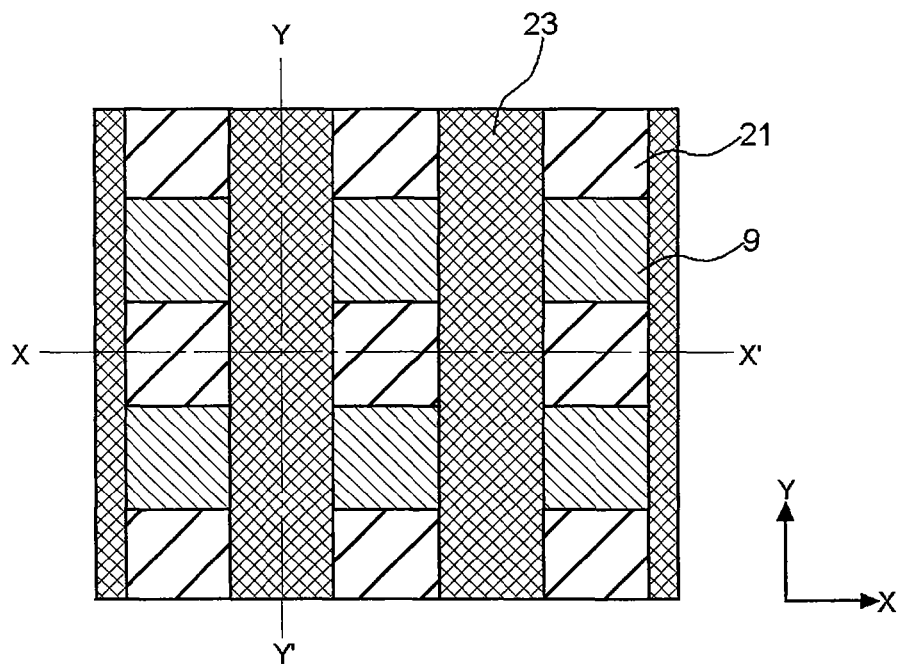
FIG. 6A
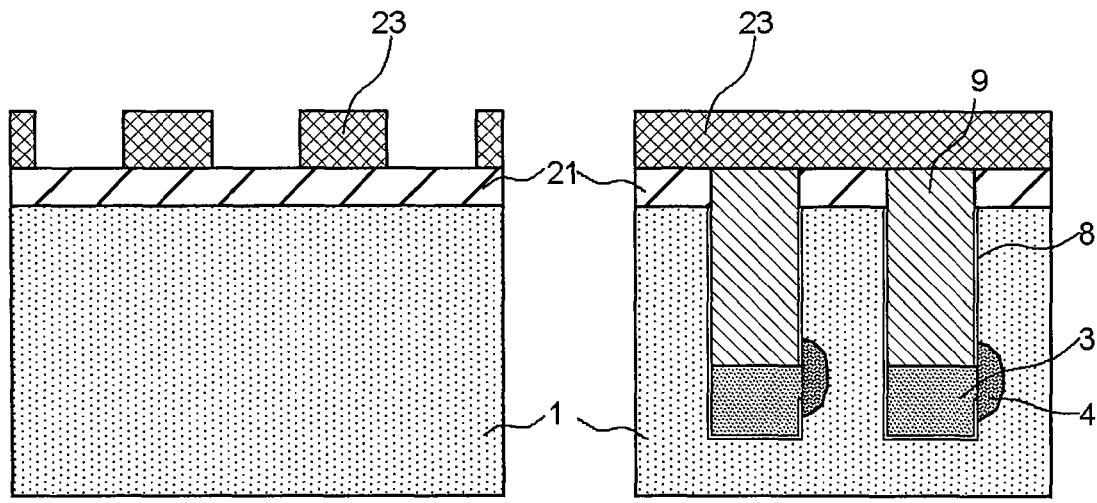
FIG. 6B  FIG. 6C

METHOD OF MANUFACTURING SEMICONDUCTOR DEVICE

BACKGROUND OF THE INVENTION

1. Field of the Invention

The present invention relates to a method of manufacturing a semiconductor device, and more particularly, to a method of setting a surface height of a film, which is filled in a trench provided to a semiconductor substrate, to a position of a desired depth from an opening of the trench.

2. Description of the Related Art

The development of a high-integrated semiconductor device has been recently accelerated. As one of the approaches, it has been examined to adopt a vertical MOS transistor. For example, JP-A No. 2008-4915 (Patent Document 1) discloses a technology in which first and second source/drain areas are formed in upper and lower portions of a fin formed by a trench provided on a surface of a silicon substrate and a conductive material layer is provided to side faces of the trench via a dielectric layer, thereby forming a gate electrode. According to the technology, it is possible to reduce an area occupied by a memory cell by a half or less and to thus obtain a high-integrated NAND flash memory array.

However, in Patent Document 1, after the dielectric layer and the conductive material layer are deposited on a whole surface of the substrate having the trench formed thereto, an etching-back is performed as it is. Thus, sidewall gates are separately formed at both sides of the trench.

In general, it is necessary to reduce a parasitic capacity between a source/drain and a gate, which occurs at overlapped portions of a source/drain area and sidewall gate electrodes formed at an upper portion of silicon pillar. Accordingly, a height of an upper end of the sidewall gate electrode of a vertical MOS transistor formed to the pillar-type silicon should be lower than a height of an upper end of the silicon pillar, i.e., a height of a trench opening by a predetermined distance. Due to this, the etching-back for the conductive material layer should be performed in such a way that over-etching is continuously performed even after the sidewall gate electrodes at both sides of the trench are separated, thereby making a height of an upper end of the sidewall gate electrode be a predetermined height. The over-etching is hardly controllable because the etching is unusually progressed not only on the upper end of the sidewall gate electrodes but also on the side surfaces of the sidewall gate electrodes, so that a partially thinned portion is generated by irregularly progressing side etching or heights of the sidewall gate electrodes become non-uniform.

SUMMARY

The invention has been made to solve the above problems. An object of the invention is to provide a method capable of forming a sidewall film on a side surface of a trench while suppressing non-uniformity of depths from a trench opening on an upper surface of the sidewall film, without etching-damage on a surface of the sidewall film when forming the sidewall film on the side surface of the trench.

Another object of the invention is to provide a method capable of, when a film filled in a trench is etched back to set a film surface at a desired position from a trench opening, suppressing non-uniformity of depths thereof.

According to an exemplary embodiment of the invention, there is provided a method of manufacturing a semiconductor device comprising:

forming a first layer on a sidewall of a trench formed on a main surface of a semiconductor substrate;

filling up the trench with a protective film; and etching back the protective film by a dry etching method so that a height of a surface of the protective film is lower than an opening of the trench and a portion of the first layer is exposed, and removing the exposed portion of the first layer.

According to another exemplary embodiment of the invention, there is provided a method of manufacturing a semiconductor device comprising:

forming a first trench, a second trench and semiconductor pillars fitted in the first and second trenches on a main surface of a semiconductor substrate;

forming a gate electrode film on side faces of the first and second trenches via a gate insulating film regarding to the semiconductor pillars;

filling up the first and second trenches with a protective film;

etching back the protective film to expose a portion of the gate electrode film and removing the exposed portion of the gate electrode film; and forming impurity diffusion layers having a conduction type oppose to the silicon fins at the upper and lower portions of the silicon pillars, respectively.

According to a further another exemplary embodiment of the invention, there is provided a method of manufacturing a semiconductor device comprising:

providing a trench on a main surface of a semiconductor substrate and forming first and second semiconductor region isolated at least by the trench and being adjacent to each other;

sequentially depositing an insulating film, a first layer and a second layer on side faces of the first and second semiconductor regions in the trench;

filling up the trench with a protective film; and etching back the protective film to expose a portion of the second layer and removing the exposed portion of the second layer, wherein the insulating film and the second layer are connected to each other via an opening provided to the first layer, and further comprising:

after removing the exposed portion of the second layer, further selectively removing the second layer using a mask having an opening exposing at least a part of a surface of the second layer of one of the first and second semiconductor regions, exposing the first layer and the insulating film to the opening of the first layer and removing the exposed insulating film to expose a side surface of one of the first and second semiconductor regions.

In addition, according to additional exemplary embodiment of the invention, there is provided a method of manufacturing a semiconductor device including filling up a trench formed on a main surface of a semiconductor substrate with a first layer and etching-back the first layer by a dry etching method so that an upper end of the first layer in the trench is lower than a height of an opening edge of the trench by a predetermined value, wherein a depression having a slope of an angle θ1 to a horizontal plane is provided to a surface of the first layer in the trench before the etching-back and an angle θ2 of the slope of the depression to the horizontal plane after the etching-back is smaller than the angle θ1.

According to the above exemplary embodiments, when the etching-back is performed so that a height of an upper end of a layer filled in a trench formed on a surface of a semiconductor substrate is lower than an opening of the trench by a predetermined height, it is possible to reduce the non-uniformity of heights in a wafer.

In addition, when the etching-back is performed so that a height of an upper end of a film formed on the inner walls of the trench formed on the surface of the semiconductor substrate is lower than an opening edge of the trench by a predetermined height, it is possible to reduce the non-uniformity of heights in a wafer and to prevent the film thickness from being reduced due to an over-etching of the film surface.

In particular, it is possible to control an etching end point, which has been conventionally controlled by time, by a shape of a depression of the film surface formed in the trench in a self-aligned manner.

BRIEF DESCRIPTIONS OF THE DRAWINGS

The above features and advantages of the present invention will be more apparent from the following description of certain preferred embodiments taken in conjunction with the accompanying drawings, in which:

FIGS. 3A to 3C are views for illustrating a process of manufacturing a semiconductor device according to a first exemplary embodiment, in which FIG. 3A is a plan view and FIGS. 3B and 3C are sectional views taken along lines X-X' and Y-Y' of FIG. 3A, respectively.

FIGS. 4A to 4C are views for illustrating a process of manufacturing a semiconductor device according to a first exemplary embodiment, in which FIG. 4A is a plan view and FIGS. 4B and 4C are sectional views taken along lines X-X' and Y-Y' of FIG. 4A, respectively.

FIGS. 5A to 5C are views for illustrating a process of manufacturing a semiconductor device according to a first exemplary embodiment, in which FIG. 5A is a plan view and FIGS. 5B and 5C are sectional views taken along lines X-X' and Y-Y' of FIG. 5A, respectively.

FIGS. 6A to 6C are views for illustrating a process of manufacturing a semiconductor device according to a first exemplary embodiment, in which FIG. 6A is a plan view and FIGS. 6B and 6C are sectional views taken along lines X-X' and Y-Y' of FIG. 6A, respectively.

FIGS. 7A to 7D are views for illustrating a process of manufacturing a semiconductor device according to a first exemplary embodiment, in which FIG. 7A is a plan view and FIGS. 7B, 7C and 7D are sectional views taken along lines X-X', Y-Y' and X1-X1' of FIG. 7A, respectively.

FIGS. 8A to 8D are views for illustrating a process of manufacturing a semiconductor device according to a first exemplary embodiment, in which FIG. 8A is a plan view and FIGS. 8B, 8C and 8D are sectional views taken along lines X-X', Y-Y' and X1-X1' of FIG. 8A, respectively.

FIGS. 9A to 9D are views for illustrating a process of manufacturing a semiconductor device according to a first exemplary embodiment, in which FIG. 9A is a plan view and FIGS. 9B, 9C and 9D are sectional views taken along lines X-X', Y-Y' and X1-X1' of FIG. 9A, respectively.

FIGS. 10A to 10D are views for illustrating a process of manufacturing a semiconductor device according to a first exemplary embodiment, in which FIG. 10A is a plan view and FIGS. 10B, 10C and 10D are sectional views taken along lines X-X', Y-Y' and X1-X1' of FIG. 10A, respectively.

FIGS. 11A to 11D are views for illustrating a process of manufacturing a semiconductor device according to a first exemplary embodiment, in which FIG. 11A is a plan view and FIGS. 11B, 11C and 11D are sectional views taken along lines X-X', Y-Y' and X1-X1' of FIG. 11A, respectively.

FIGS. 12A to 12D are views for illustrating a process of manufacturing a semiconductor device according to a first exemplary embodiment, in which FIG. 12A is a plan view and FIGS. 12B, 12C and 12D are sectional views taken along lines X-X', Y-Y' and X1-X1' of FIG. 12A, respectively.

FIGS. 13A and 13B show a change in slopes of a surface of a protective film, in which FIG. 13A shows a state before a second etching-back for protective film and FIG. 13B shows a state after the second etching-back for protective film.

FIGS. 14A to 14D are views for illustrating a process of manufacturing a semiconductor device according to a first exemplary embodiment, in which FIG. 14A is a plan view and FIGS. 14B, 14C and 14D are sectional views taken along lines X-X', Y-Y' and X1-X1' of FIG. 14A, respectively.

FIGS. 15A to 15D are views for illustrating a process of manufacturing a semiconductor device according to a first exemplary embodiment, in which FIG. 15A is a plan view and FIGS. 15B, 15C and 15D are sectional views taken along lines X-X', Y-Y' and X1-X1' of FIG. 15A, respectively.

FIGS. 16A to 16D are views for illustrating a process of manufacturing a semiconductor device according to a first exemplary embodiment, in which FIG. 16A is a plan view and FIGS. 16B, 16C and 16D are sectional views taken along lines X-X', Y-Y' and X1-X1' of FIG. 16A, respectively.

Figure 12A:
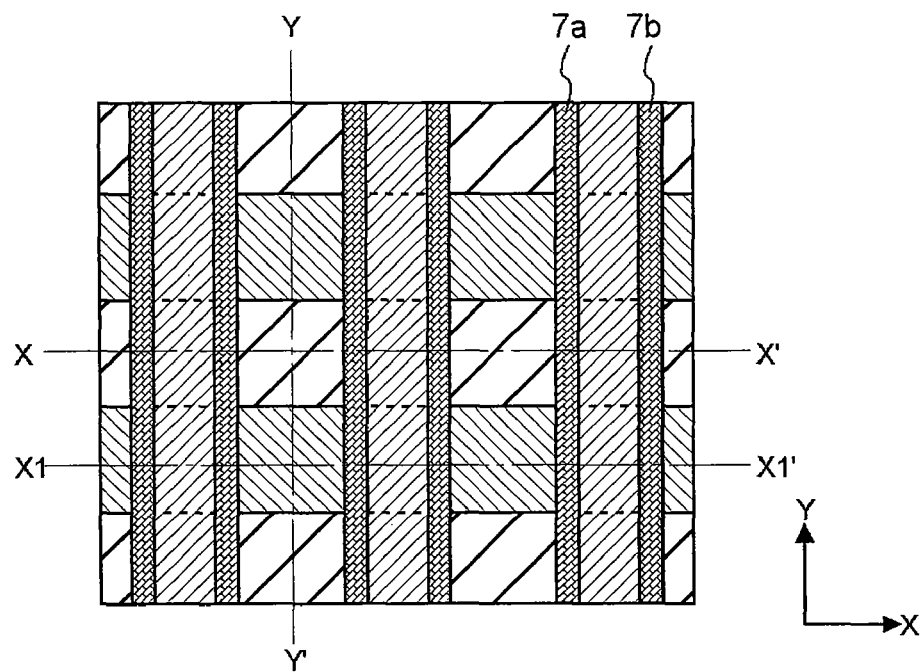
Figure 12B:
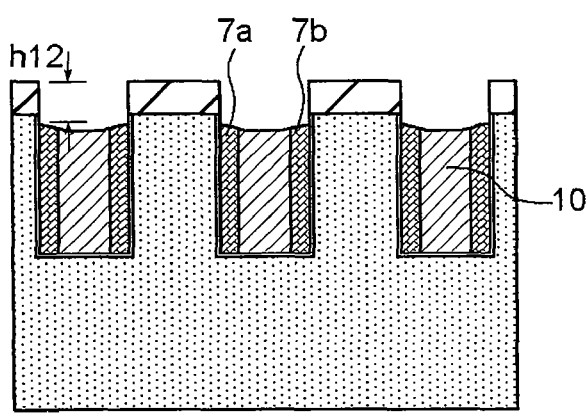
Figure 12C:
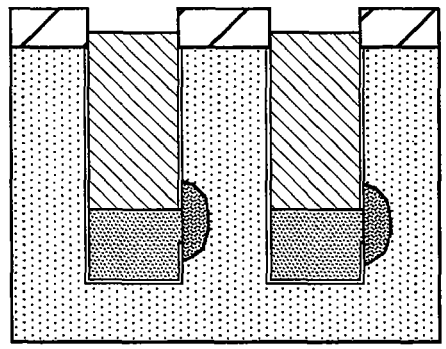
Figure 12D:
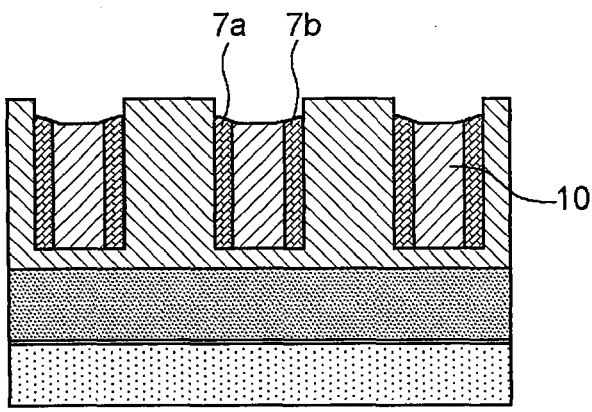
Figure 17A:
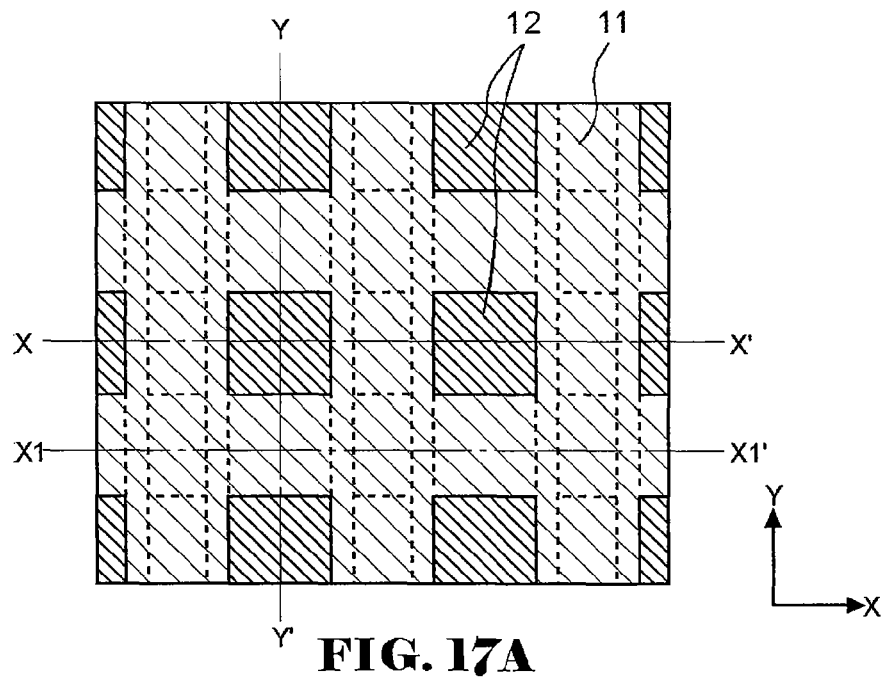
Figures 17B, 17C:
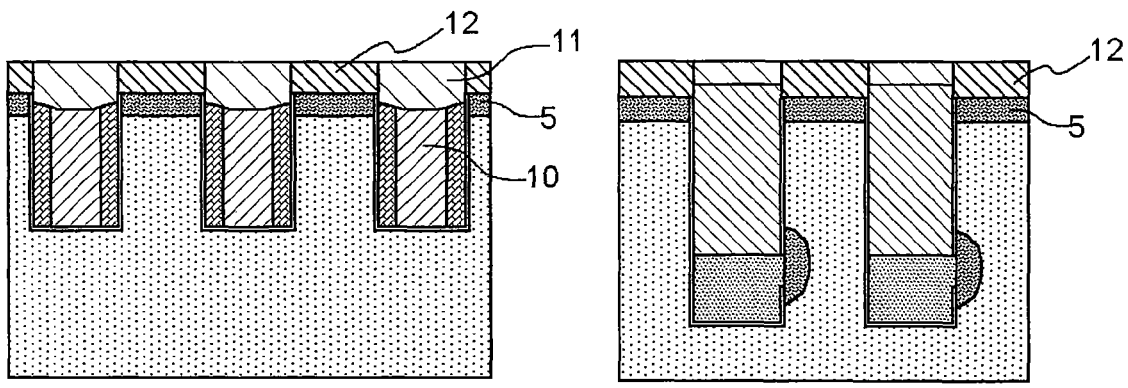
Figure 17D:
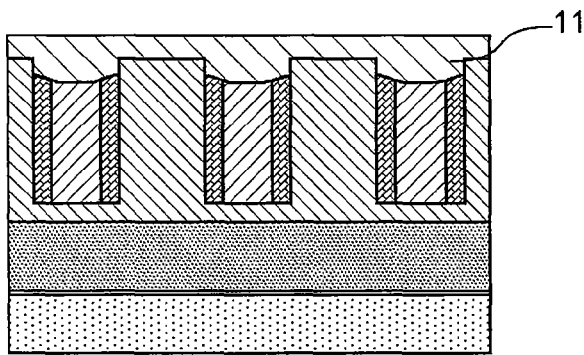
Figure 18:
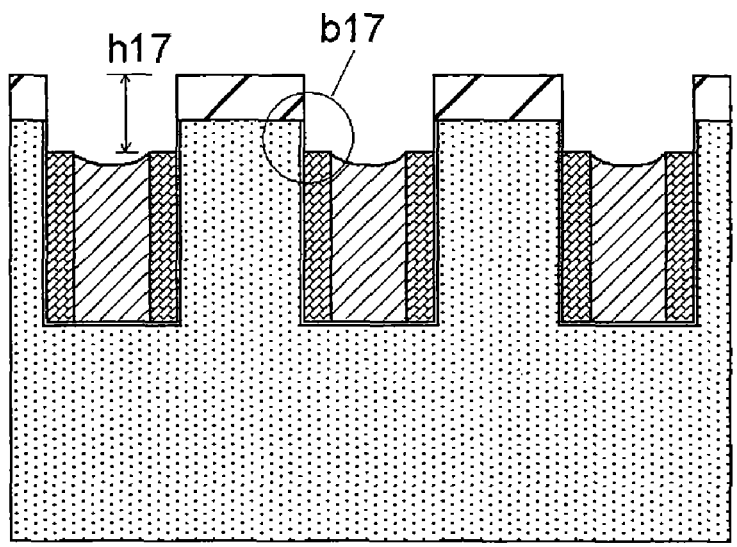

FIGS. 17A to 17D are views for illustrating a process of manufacturing a semiconductor device according to a first exemplary embodiment, in which FIG. 17A is a plan view and FIGS. 17B, 17C and 17D are sectional views taken along lines X-X', Y-Y' and X1-X1' of FIG. 17A, respectively FIG. 18 is a sectional view corresponding to X-X' section of FIG. 12B, and illustrates a process of a semiconductor device according to a modified example of the first exemplary embodiment.

Figure 19:
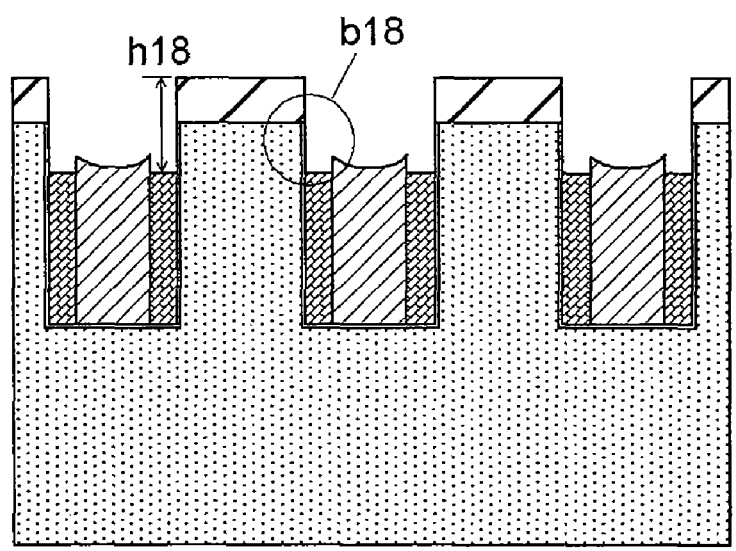

FIG. 19 is a sectional view corresponding to X-X' section of FIG. 12B, and illustrates a process of a semiconductor device according to a modified example of the first exemplary embodiment.

Figure 2A:
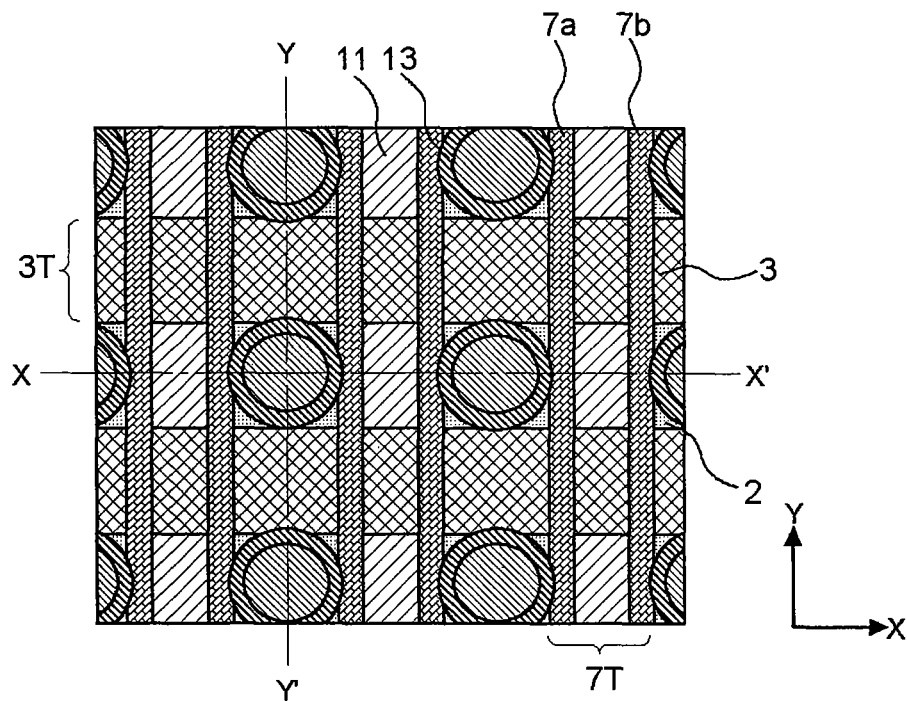
FIG. 2A is a plan view corresponding to the DRAM memory cell array circuit shown in FIG. 1.

FIGS. 20 to 31 are sectional views corresponding to Y-Y' section of FIG. 2A, and illustrate a process of a semiconductor device according to a second exemplary embodiment

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

First, a structure of a DRAM device that is an example of a semiconductor device to which the invention is applied will be briefly described.

Figure 1:
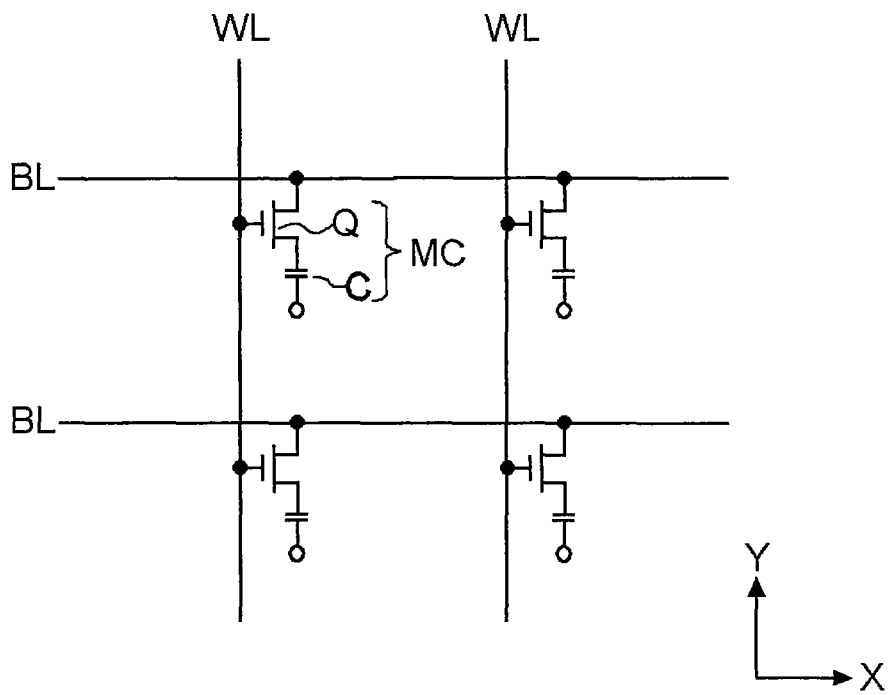
FIG. 1 is a circuit diagram showing a memory cell array of a DRAM relating to an exemplary embodiment of the invention.

FIG. 1 is a circuit diagram showing a memory cell array of a DRAM relating to an exemplary embodiment of the invention.

A plurality of word lines WLs and a plurality of bit lines BLs are arranged perpendicularly to each other and each intersection is provided with a memory cell MC. Each memory cell MC includes a serial circuit of an N channel type MOS transistor Q for selection and a capacitor C. One of source/drain of the N channel type MOS transistor Q for selection is connected to one end of the capacitor C, the other of the source/drain is connected to the bit line BL and the gate is connected to the word line WL. The other end of the capacitor C is applied with a constant potential, for example an intermediate potential between a supply potential and a ground potential.

Figure 2C:
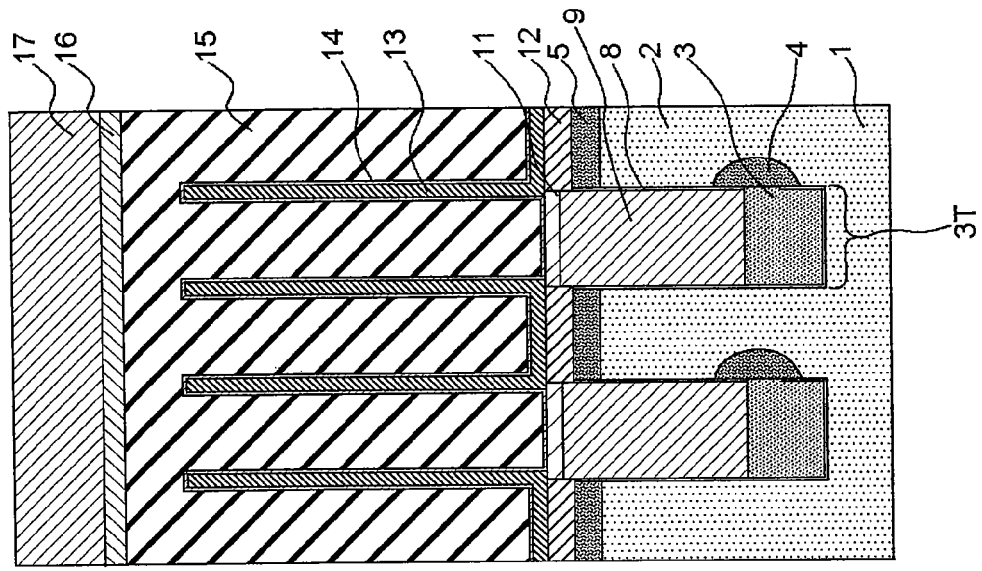
FIGS. 2B and 2C are sectional views taken along lines X-X' and Y-Y' of FIG. 2A, respectively.
Figure 2B:
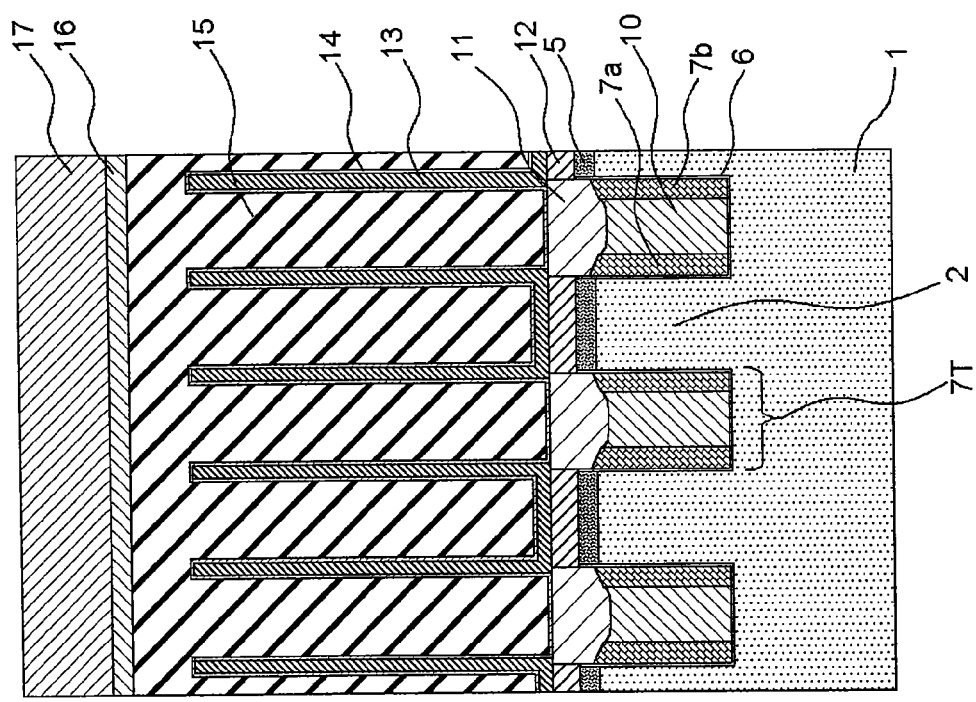
Figure 7A:
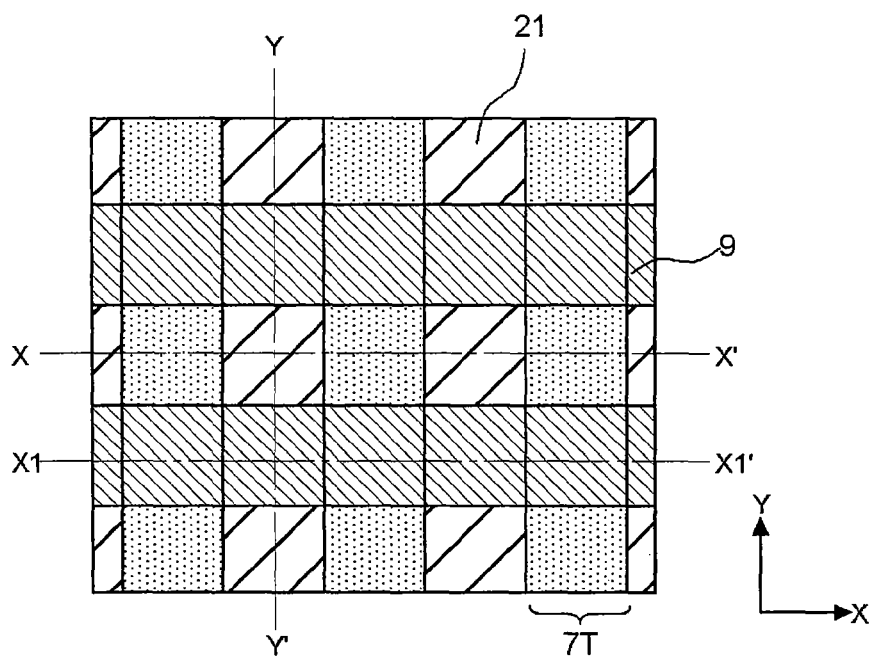
Figure 7D:
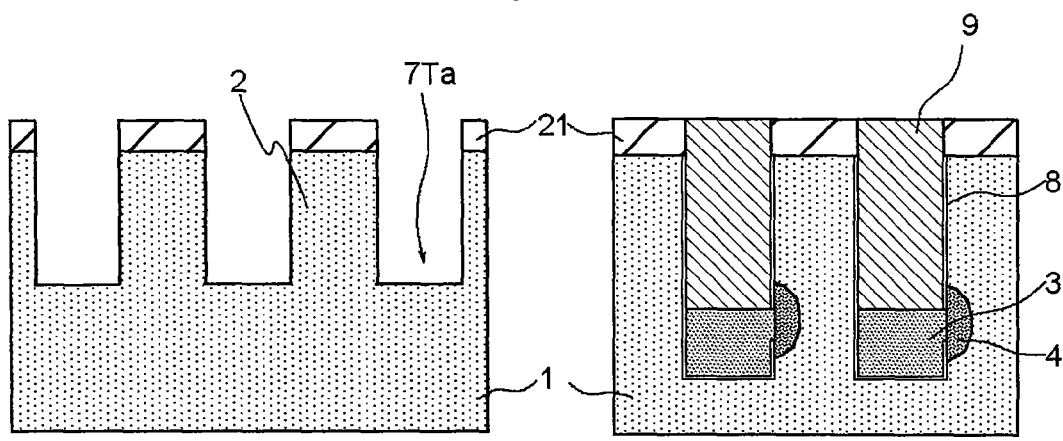
Figure 7D:
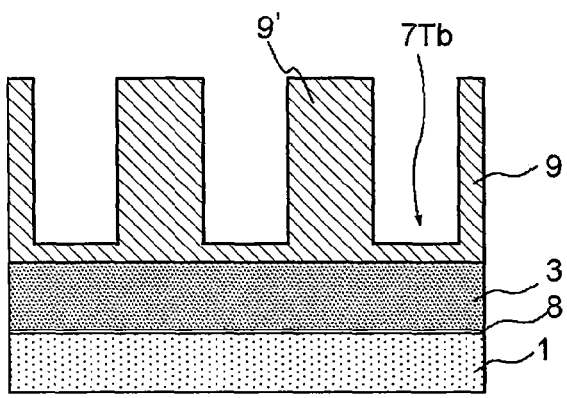

FIG. 2A is a plan view corresponding to the DRAM memory cell array circuit shown in FIG. 1. FIGS. 2B and 2C show sectional views taken along with lines X-X' and Y-Y' of FIG. 2A, respectively. In FIG. 2A, an interlayer insulating and the like are not shown so as to easily understand the structures of main constitutional elements.

Referring to FIGS. 2A to 2C, silicon pillars 2, which are formed in p-type silicon substrate 1 and are surrounded by trenches 3T (first trenches) for bit line formation and trenches 7T (second trenches) for word line formation, are arranged in an array pattern. Bit lines 3 formed at lower portions of trenches 3T for bit line formation adjacent to silicon pillars 2 and made of conductive material are extended in an X direction (a first direction). Bit lines 3 are connected to N-type impurity diffusion layers 4 formed in silicon pillars 2 via openings formed in insulating film 8 provided on inner walls of trenches 3T for bit line formation. In the meantime, word lines 7a, 7b are provided to sidewalls of trenches 7T for word line formation adjacent to silicon pillars 2 so that they sandwich silicon pillars 2 at both sides thereof via gate insulating film 6, and are extended in a Y direction (a second direction). Silicon pillars 2 are provided at upper portions thereof with N-type impurity diffusion layers 5 that form the sources/drains of the vertical MOS transistors together with N-type impurity diffusion layers 4. Furthermore, cylinder-shaped capacitors including lower electrodes 13, dielectric film 14 and upper electrodes 15 are provided above silicon pillars 2. Lower electrodes 13 are connected to N-type diffusion layers 5 via contact plugs 12. Interlayer insulating films 16, 17 are provided on upper electrodes 15.

Exemplary Embodiment 1

In the followings, a process of manufacturing a semiconductor device according to a first exemplary embodiment will be described.

FIG. 3A to FIG. 12A and FIG. 14A to FIG. 17A are plan views; FIG. 3B to FIG. 12B, FIG. 14B to FIG. 17B, FIG. 18 and FIG. 19 are sectional views taken along a line X-X'; FIG. 3C to FIG. 12C and FIG. 14C to FIG. 17C are sectional views taken along a line Y-Y'; and FIG. 7D to FIG. 12D and FIG. 14D to FIG. 17D are sectional views taken along a line X1-X1'. These figures show a process of manufacturing a semiconductor device according to a first exemplary embodiment. Herein, an example will be described in which the invention is applied to a process of forming word lines 7a, 7b in trenches 7T for word line formation shown in FIG. 2A, FIG. 2B and FIG. 2C.

As shown in FIGS. 3A, 3B and 3C, mask nitride film 21 having a thickness of about 30 nm is formed on p-type silicon substrate 1.

Photoresist mask 22 is formed on mask nitride film 21 with a photolithography technique. The photoresist mask is formed into a line and space pattern having a width of about 60 nm and an interval of about 60 nm in a Y direction (refer to FIG. 3A).

Mask nitride film 21 and silicon substrate 1 are sequentially etched using photoresist mask 22 as a mask, thereby forming silicon fins 2' and trenches 3T for bit line formation extending in the X direction. In this exemplary embodiment, silicon substrate 1 is etched by about 300 nm depth.

Next, as shown in FIGS. 4A, 4B and 4C, photoresist mask 22 is removed. Continuously, insulating film 8 that coats sidewalls of silicon fin 2' and a bottom surface of trench 3T for bit line formation and has an opening removed at a lower portion of one of two side surfaces of silicon fin 2' (the opening is referred to as a bit contact) is formed with a silicon oxide film, for example, and bit line 8 is formed at a lower portion of trench 3T for bit line formation, so that bit line 3 is connected to the sidewall of silicon fin 2' via the bit contact. The sidewall portion of silicon fin 2' to which bit line 3 is connected is formed with N-type impurity diffusion layer 4 made of arsenic impurities. Bit line 3 has a height of about 100 nm from the bottom surface of trench 3T for bit line formation and is extended in the X direction along the sidewalls of silicon fin 2'. The bit line, the bit contact and impurity diffusion layer 4 can be formed by using the method disclosed in JP-A No. 2009-10366 (Drawings 8 to 14), for example.

Next, as shown in FIGS. 5A, 5B and 5C, an embedded insulating film is formed so as to fill up the inside of trench 3T for bit line formation. As the embedded insulating film, a silicon oxide film is filled in the trench and thus formed on the whole surface of the silicon substrate. Then, a CMP method is used to abrasively remove the film and thus to fill up trench 3T for bit line formation with the embedded insulating film 9.

Next, as shown in FIG. 6A, photoresist mask 23, which extends in the Y direction and has a width of about 60 nm and an interval of about 60 nm in the X direction, is formed with the photolithography technique.

Next, as shown in FIGS. 7A, 7B, 7C and 7D, mask nitride film 21 and silicon fin 2' are sequentially etched using photoresist mask 23 as a mask. In addition, embedded insulating film 9 in trenches 3T for bit line formation is etched by using photoresist mask 23 as a mask, so that silicon pillars 2 and trenches 7T for word line formation are formed. By etching silicon substrate 1 by a depth of about 150 nm, silicon pillars 2 having a height of about 150 nm are formed. In the meantime, embedded insulating film 9 is etched by a depth of about 180 nm, so that embedded insulating film 9 of about 50 nm is left on the upper surface of bit line 3. The etching is performed not to expose the upper surface of the bit line. Trench for the embedded insulating film 7Tb is formed between embedded insulating film pillar 9' made of embedded insulating film 9 and an embedded insulating film pillar that is adjacent thereto in the X direction. Sidewalls of the silicon pillars, sidewalls of the embedded insulating film pillars, bottoms surfaces of second trenches 7Ta and bottom surfaces of trench for the embedded insulating films 7Tb are respectively aligned in the Y direction, thereby forming trenches 7T for word line formation.

Each of silicon pillar 2 and embedded insulating film pillar 9' has an approximately rectangular shape having widths of about 60 nm in the X and Y directions when seen from a plan view parallel to the substrate.

Next, as shown in FIGS. 8A, 8B, 8C and 8D, gate insulating film 6 is formed on the sidewalls of silicon pillar 2 and on the bottom surface of trench 7T for word line formation. A silicon oxide film is used as the gate insulating film. A thermal oxidation method is used to form the gate insulating film having a thickness of about 5 nm. The material and the formation method are not limited to the above. For example, a silicon oxynitride film, a metal oxide film having a high dielectric constant by a CVD method and the like may be used.

Continuously, gate electrode film 7 is formed. A titanium nitride film is used as the gate electrode film. A thickness of the film is about 20 nm.

Gate electrode film 7 is etched back to form gate electrodes (which are precursors of word lines 7a, 7b and thus indicated with reference numerals 7a', 7b') on the sidewalls of the silicon pillar and the sidewalls of the embedded insulating film (the etching is referred to as an etching-back for gate electrodes). Herein, gate electrode film 7 on mask insulating film 21, on the bottom surface of trench 7T for word line formation, on the embedded insulating film and on the bottom surface of the trench for the embedded insulating film is removed by etching to separately form gate electrodes 7a', 7b'. At this time, taking into consideration the non-uniformity of thickness of gate electrode film 7 and the non-uniformity of etching rates, an over-etching is further performed for the gate electrode film so as to prevent the film from being left without being etched. The upper surfaces of the gate electrodes are recessed from the upper surface of mask insulating film 21 by about 10 to 30 nm (h8) and from the upper surface of the embedded insulating film by about 10 to 30 nm (h8') (refer to FIGS. 8B and 8D). The recessed amounts h8, h8' are preferably the thickness equivalent to gate electrode film 7 (about 20 nm in this exemplary embodiment). The etching has been performed using gas including chlorine-based gas. The etched amount is a small amount such as the thickness equivalent to the gate electrode film. Accordingly, there are no problems such that the gate electrodes are etched in the sidewall direction and a horizontal width thereof is thinned, the surfaces of the sidewalls thereof are etched and thus roughened and the upper surfaces thereof are etched and thus heights thereof become irregular.

Figure 8A:
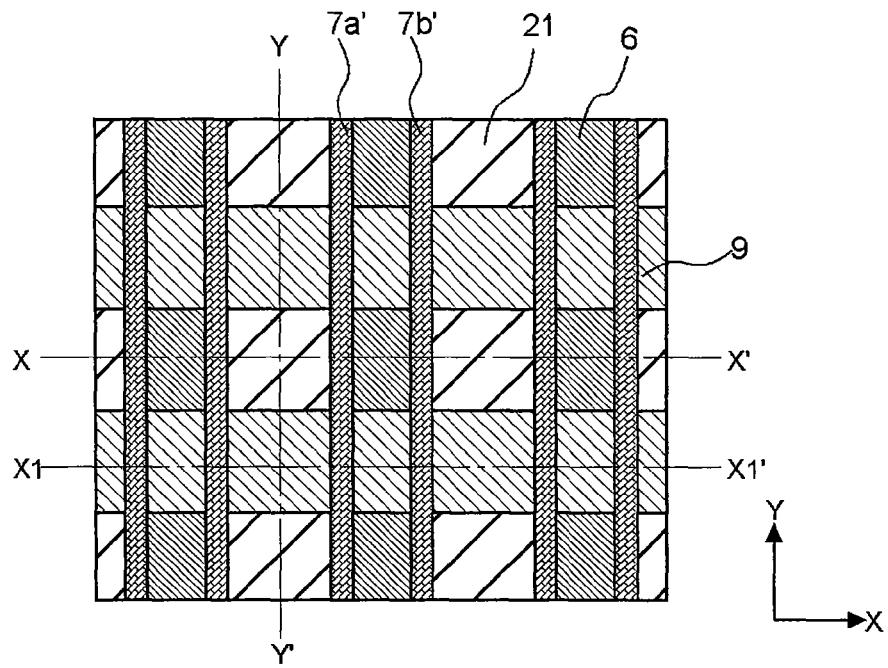
Figure 8D:
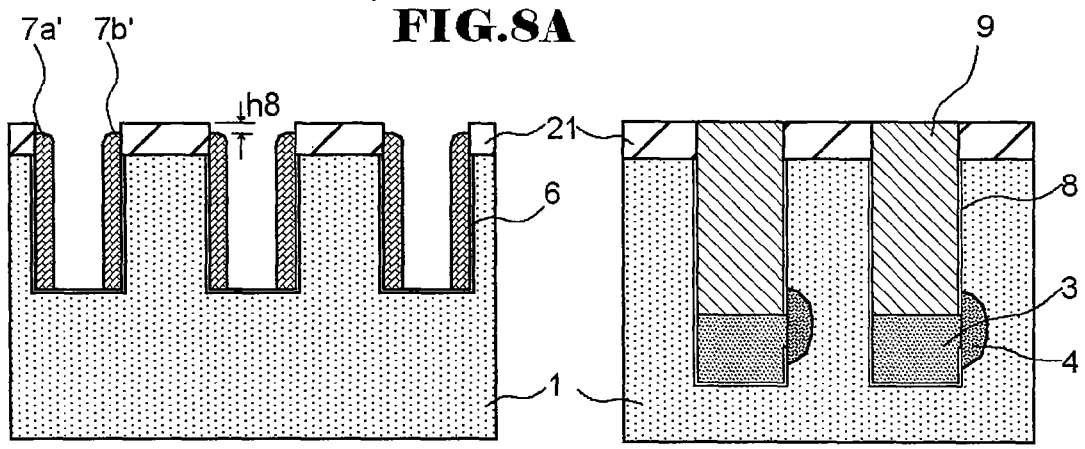

Gate electrodes 7a', 7b' are extended in the Y direction over the sidewalls of silicon pillars 2 and the sidewalls of embedded insulating film 9 (refer to FIG. 8A). Gate electrodes 7a', 7b' are electrically isolated between the silicon pillars adjacent to each other in the X direction and between the embedded insulating film pillars.

Figure 9A:
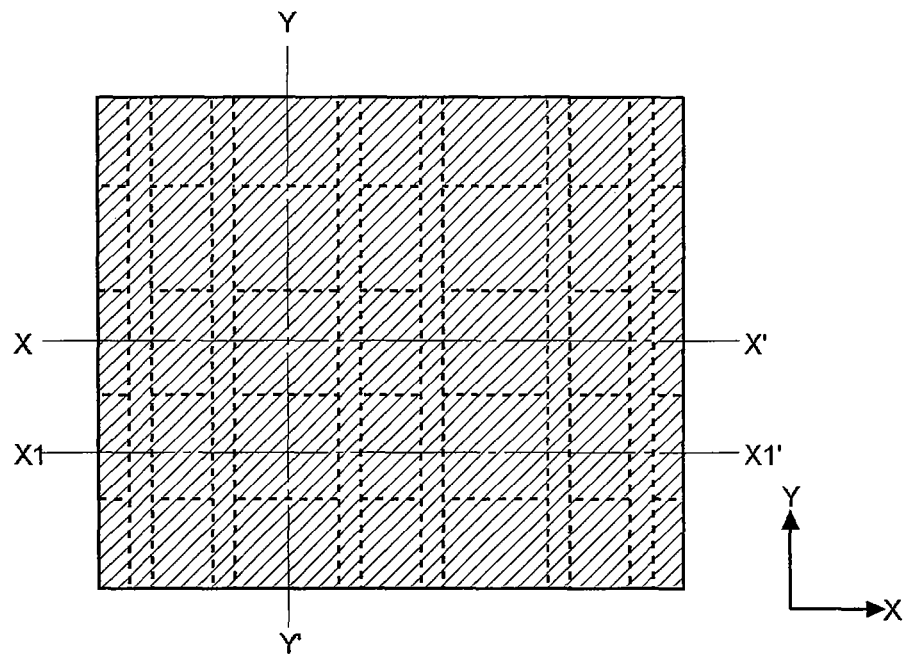
Figure 9B:
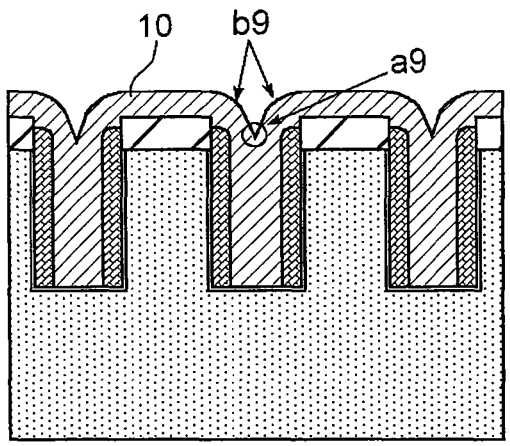
Figure 9C:
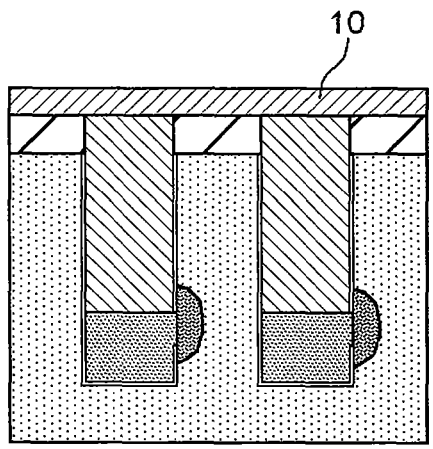
Figure 9D:
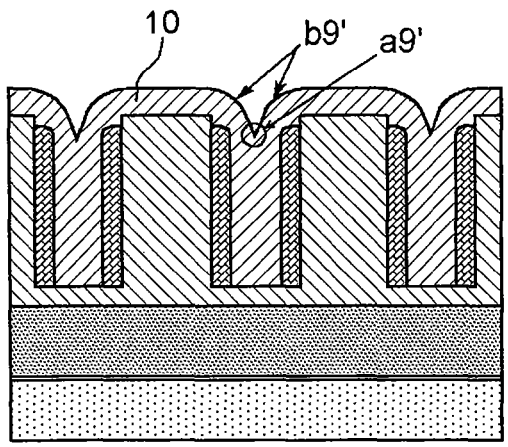
Figure 10A:
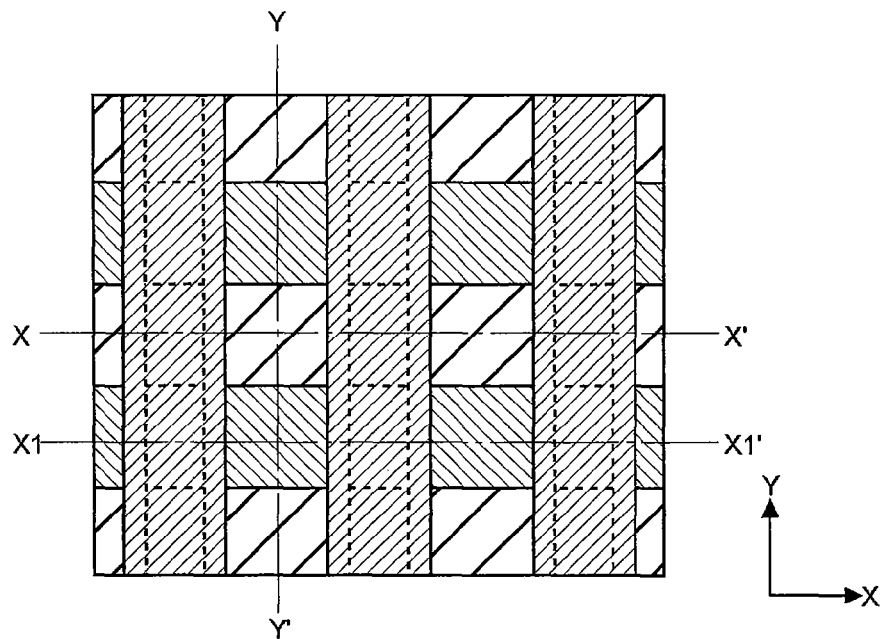
Figure 10B:
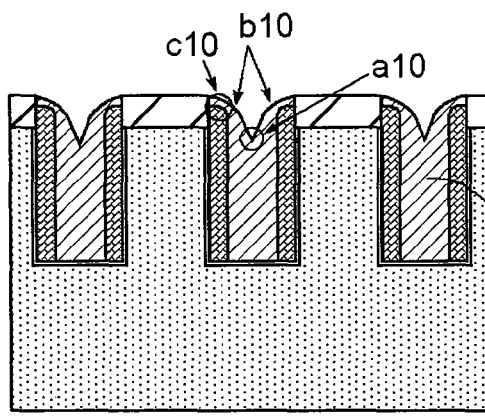
Figure 10C:
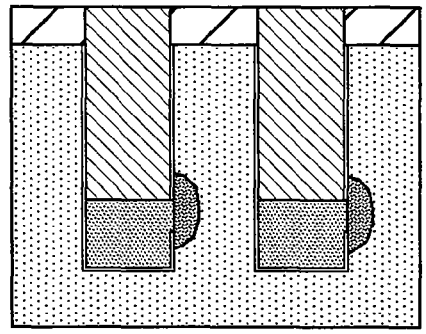
Figure 10D:
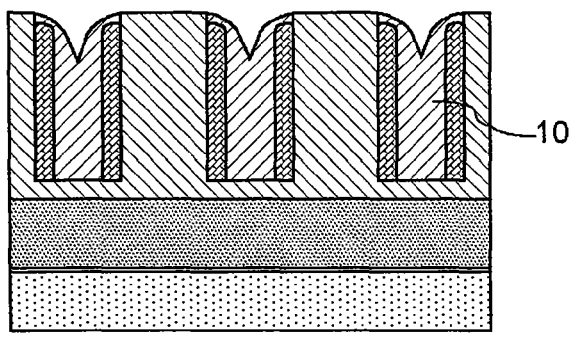
Figure 11A:
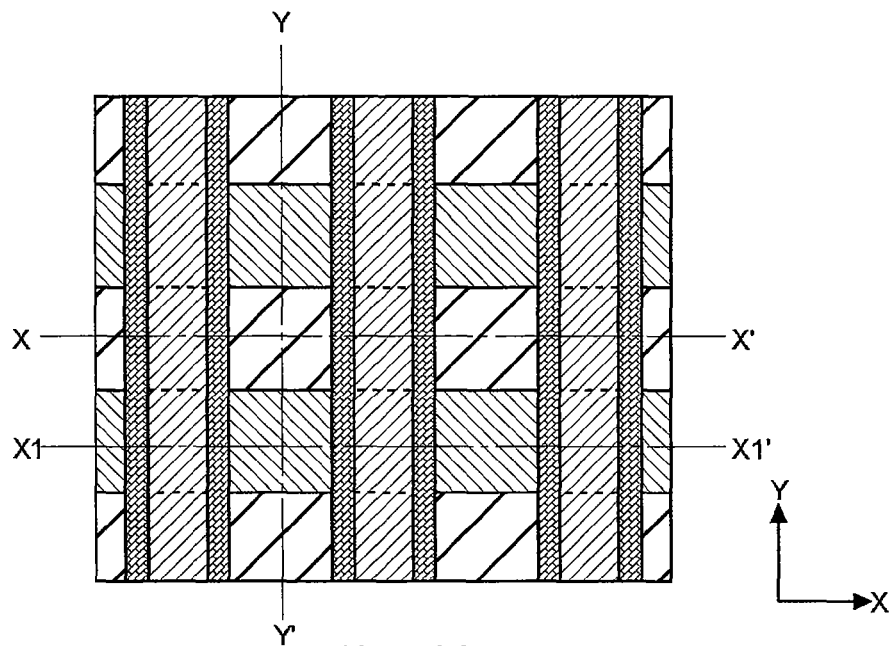
Figure 11B:
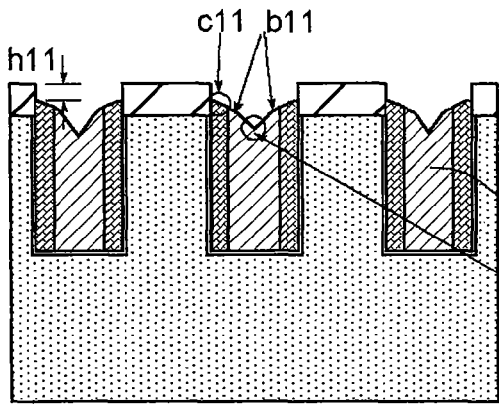
Figure 11C:
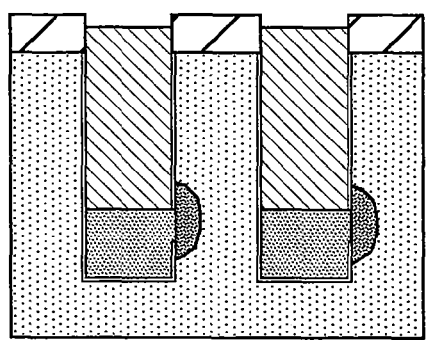
Figure 11D:
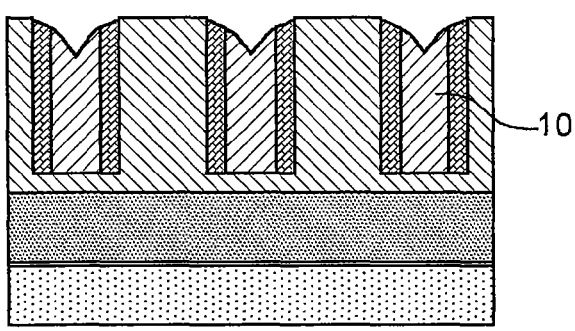

Next, as shown in FIG. 9A, trench 7T for word line formation is filled with protective film 10. At this time, as shown in FIG. 9B, in the X-X' section, protective film 10 is formed in such a way that a depression having inclined portions b9 and a bottom portion a9 is formed at an upper center portion of trench 7Ta for word line formation. As shown in FIG. 9D, in the X1-X1' section, a depression having inclined portions b9' and a bottom portion a9', which has a shape the same as the depression formed at trench 7Ta for word line formation in the X-X' section, is formed at an upper center portion of trench 7Tb for word line formation.

A silicon oxide film has been used as the material of protective film 10. An LPCVD method is used to grow the film. The growth method is not limited thereto. For example, a plasma CVD method, an ALD method and the like can be used. In order to obtain the above depression shape, the film is formed to have a thickness within a range of a half or greater of the width of the trench for bit line formation (the gate electrodes are excluded) and under the width of the trench for bit line formation. Herein, the film thickness has been about 50 nm.

For a film having poor step coverage such as a film formed by the plasma CVD method, a void may be formed on the bottom of the trench for word line formation. Even the film having the void formed therein, there is no problem as long as the void is formed at a position at which an upper portion of the void is not exposed in a process shown in FIG. 14.

Next, as shown in FIG. 10, protective film 10 is etched back to expose the upper portion of mask nitride film 21 (this etching is referred to as a first etching-back for protective film). In this process, the surface of protective film 10 substantially keeps its shape and is moved to a lower position, so that a depression having inclined portions b10 and a bottom portion a10 is formed (refer to FIG. 10B). At this time, an angle of the protective film surface to a horizontal surface in the depression (an angle of elevation toward inclined portion b10 from bottom portion a10 of the depression) is indicated with θ1.

The etching is performed using gas including fluorine-based gas, i.e., $CF_4$. An example of the etching conditions is as follows.

Gas: $CF_4$: 100 sccm
Bias power: 180 W
Source power: 1500 W
Pressure: 0.53 Pa (4 mTorr)

However, the gas is not limited to the above. For example, gases for dry etching a general silicon oxide film can be used. The etching is performed not to expose upper surface c10 of the gate electrode. The reason is as follows: when the titanium nitride film, which is the gate electrode material, is etched by the fluorine-based gas, (TiF based) reaction product is apt to be generated and is attached on the titanium nitride film and the mask insulating film. The reaction product is difficult to remove by ashing and the like and is apt to remain as foreign material.

Next, an etching for recessing the height of the gate electrode is performed in processes shown in FIG. 11 to FIG. 12 (this etching is referred to as a second etching-back for protective film). The second etching-back for protective film is performed using gas including boron trichloride ($BCl_3$) in the etching gas.

The etching of the silicon oxide film by the $BCl_3$ gas has a high physical etching effect. In addition to this, the etching of the silicon oxide film is progressed while an action accelerating a reducing reaction is added. The depression formed in the process of FIG. 10 is moved to a lower position, so that a depression having inclined portions b11 and a bottom portion a11 is formed. When the etching of the protective film is progressed, the upper portion of the titanium nitride film of the gate electrode is exposed and the titanium nitride film is etched by the $BCl_3$ gas. The etching of the titanium nitride film by the $BCl_3$ gas also has a high physical etching action effect. In addition to this, the etching is progressed while an action by chemical etching resulting from the chlorine gas included in the $BCl_3$ gas is added. The upper surface of the titanium nitride film has a slope gentler than the inclined portion b11, reflecting the shape of protective film 10 in the process of FIG. 10.

In the etching using the $BCl_3$ gas, there is no problem that a reaction product, which is generated when the titanium nitride film is etched with $CF_4$ gas and is difficult to remove, is generated.

When seen from a plan view, the exposed portion of the upper surface of the titanium nitride film has a longitudinally long slit shape having a width of about 20 nm. It is required to etch the titanium nitride film having the narrow width. However, when physically etching the material having the slit shape of the narrow width, the etching ions are difficult to enter a bottom of a trench having a high aspect ratio, which is formed during the etching. Thus, it is difficult to progress the etching. In the invention, as protective film 10 contacting the sidewalls of the titanium nitride film is etched to lower the height of protective film 10, the sidewalls of the titanium nitride film are exposed and the etching ions are made to enter and etch the side surfaces of the titanium nitride film as well as the upper surface thereof. As a result, the etching can be accelerated.

An example of the etching conditions is as follows.
Gas: $BCl_3$ 120 sccm
Bias power: 80 W
Source power: 800 W
Pressure: 0.67 Pa (5 mTorr)

In this etching, the etching rates of the flat portions are approximately same such as 30 nm/min at the silicon oxide film of the protective film and 30 nm/min at the titanium nitride film. Since the physical etching action is high, the etching rate is relatively slow.

In the meantime, it was confirmed by a test that the inclined portion b11 of the protective film has a steep slope and the etching is progressed in the inclined portion b11 at the higher rate (about five times) than in the bottom portion a11 of the silicon oxide film and the portion c11 of the titanium nitride film having the gentle inclined portion.

As shown in FIG. 12, the etching is progressed in the inclined portions of the depression at the higher rate than in the bottom portion thereof, so that the slope of the inclined portion becomes gradually gentle. As a result, the shape of the depression is changed into a gentle U shape and the bottom portion thereof becomes generally flat. In the physical etching, the sputtering effect highly acts on the inclined portions and thus the etching is fast progressed. However, the sputtering effect is reduced on the flat portion, so that a deposition rate of a deposition film is increased. Thus, the etching rate is slowed at the flat bottom portion of the protective film. In addition to the fact that the etching rate of the flat portion is slower compared to the inclined portions, the etching is performed in the thin trench, so that a micro-loading effect is made. Due to this, it was found that the etching rate of the flat portion is 1/5 or less than that of the inclined portions and when a shape of the flat portion is formed, the etching is rapidly unprogressed in a depth direction.

To be more specific, regarding the gas to be used for the etching-back for protective film provided in the thin trench, it would be better if the etching resulting from the gas has a physical etching characteristic. However, it is also good even when the physical etching characteristic is not necessarily superior to the chemical etching characteristic.

Furthermore, it was also found that when the etching for protective film 10 is slowed, the etching for the titanium nitride film is also slowed. The causes may be as follows: as described in the process of FIG. 11, the physical etching is difficult to progress for the titanium nitride film in a trench having a narrow width and the deposition of the deposition film prevailing on the upper bottom of protective film 10 is also generated on the titanium nitride film.

Figure 13A:
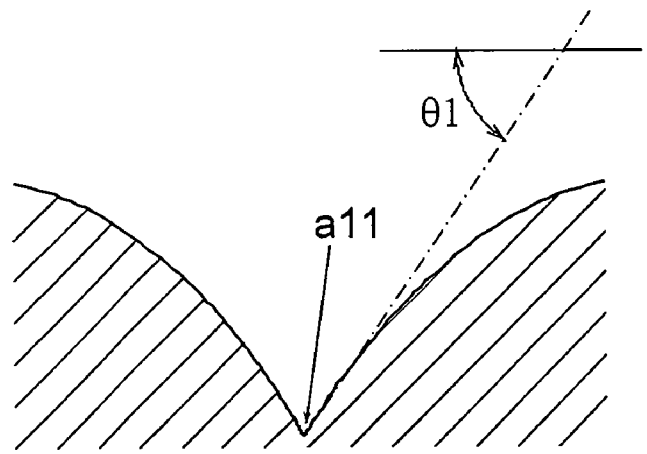
Figure 13B:
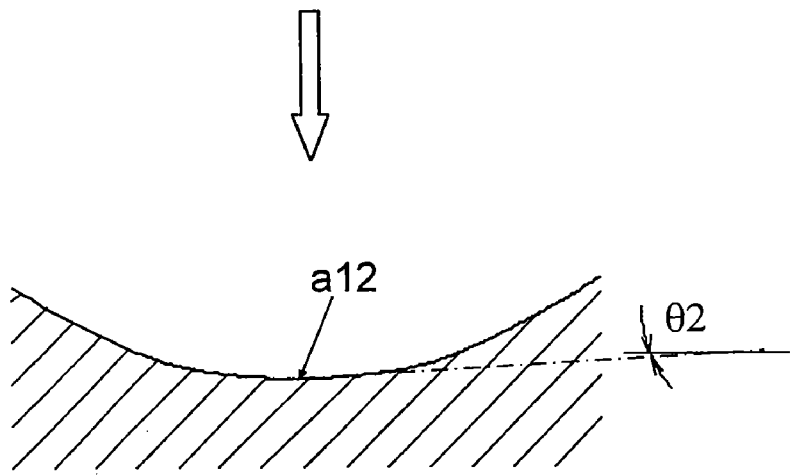
Figure 14A:
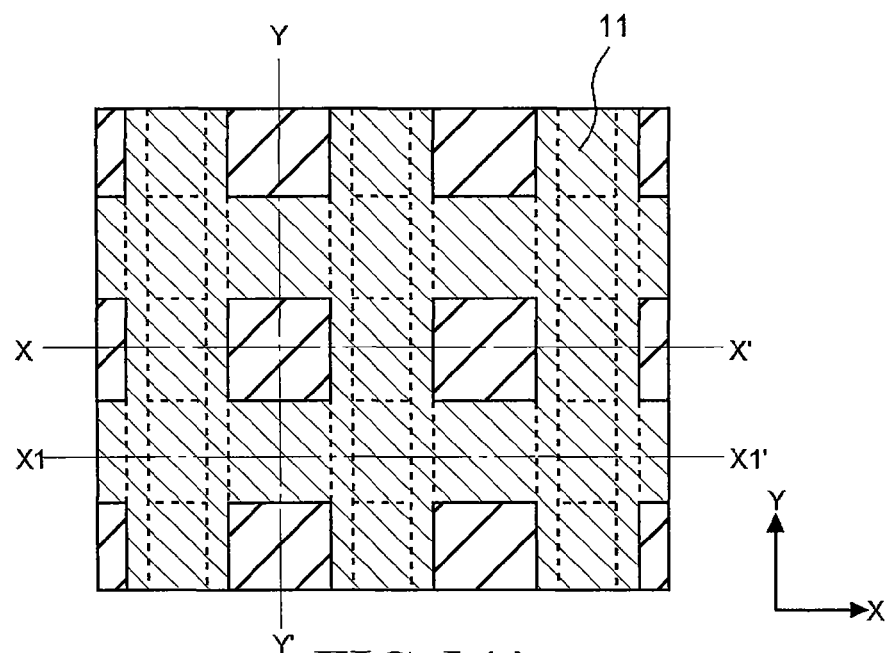
Figure 14B:
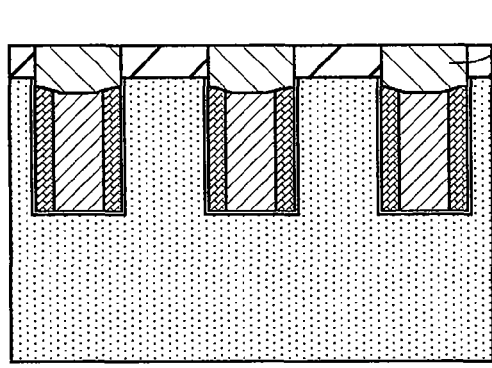
Figure 14C:
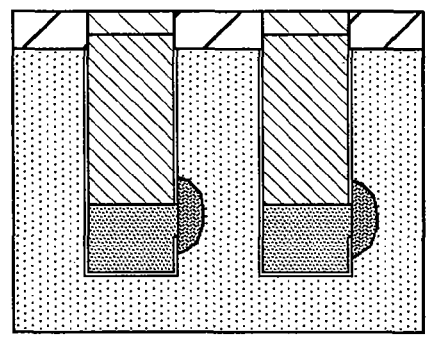
Figure 14D:
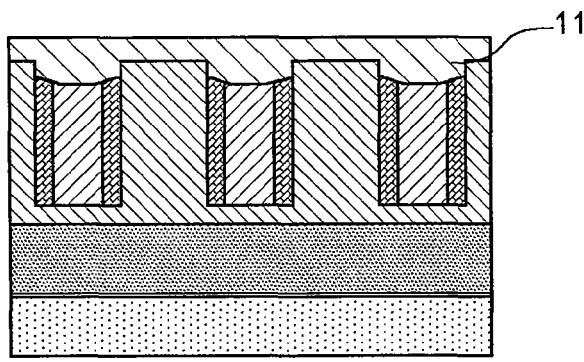
Figure 15A:
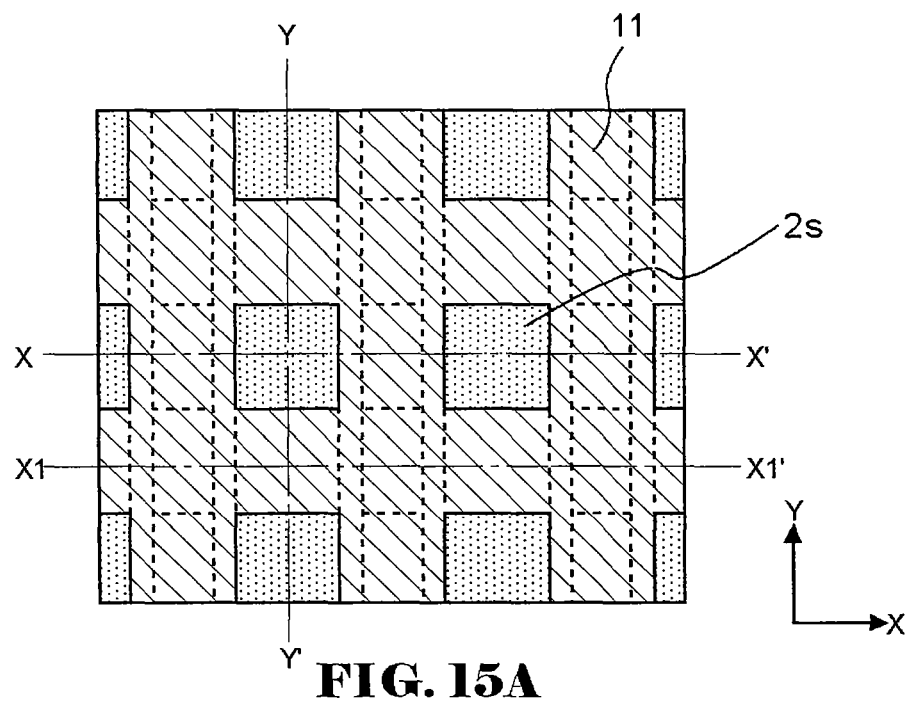
Figure 15B:
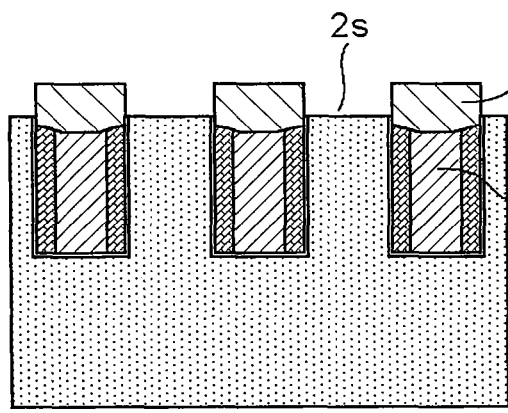
Figure 15C:
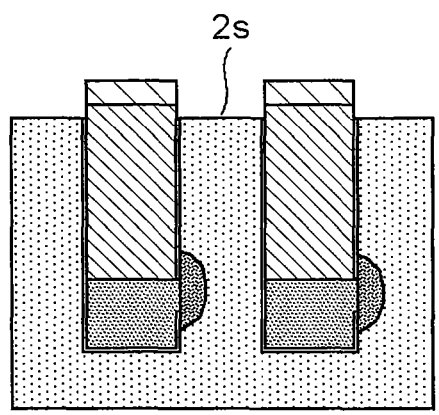
Figure 15D:
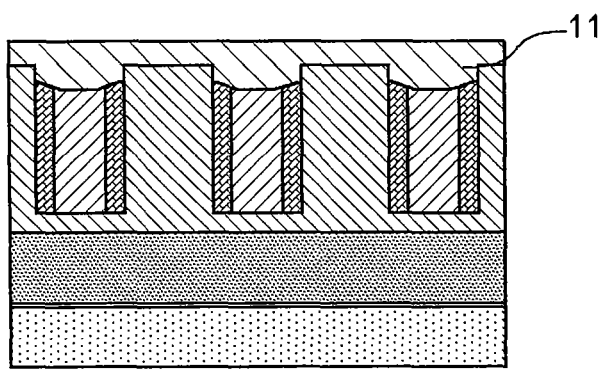

As a result, when the etching is progressed until the bottom portion of the depression of the protective film becomes flat, change in depths of the bottom portions of the silicon oxide film due to the etching is reduced and change in recessed amounts h12 of the titanium nitride film due to the etching is also reduced. Like this, when the etching is progressed until the bottom portion of the depression of the protective film becomes flat, the change in recessed amounts of the titanium nitride film becomes stable. Therefore, even when the over-etching is performed, the variation in recessed amounts is small. As a result, since the over-etching can be further performed sufficiently, it is possible to make the recessed amounts uniform in a chip and in a wafer surface. The recessed amount h12 depends on the slope shape of the depression in growing the protective film in the process of FIG. 9. When the slope is made to be steep, the recessed amount is increased, and when the slope is made to be gentle, the recessed amount is decreased. That is, it was found that the recessed amount h12 could be controlled. Compared to the prior art in which the recessed amount is controlled by the etching time, according to the invention, the slope shape of the depression in growing the protective film is controlled to control the recessed amount. As shown in FIG. 13, by doing so, an angle $\theta 2$ of the protective film surface to a horizontal surface in the depression (an angle of elevation at a portion adjacent to bottom portion 2 of the depression: refer to FIG. 13B) is smaller than $\theta 1$ (refer to FIG. 13A). When the angle $\theta 2$ is approximately 0°, the etching can be automatically ended.

Meanwhile, in the etching conditions of the processes shown in FIGS. 11 to 12, argon, helium, neon, xenon and the like, which are inert gases, may be included as the dilute gas. In addition, in order to accelerate the chemical etching effect for the titanium nitride film, chlorine gas may be included.

The first etching-back for protective film in the process of FIG. 10 is performed using the $CF_4$ gas. This is because the productivity is improved by using the $CF_4$ gas having a high etching rate for the silicon oxide film. If there is no problem regarding the productivity, the first etching-back can be performed under conditions that are used in the second etching-back for protective film. However, while the etching rate of the silicon oxide film is 120 nm/min under conditions of the first etching-back for protective film, the etching rate of the silicon oxide film is 30 nm/min under conditions of the second etching-back for protective film. Accordingly, the etching time is prolonged by about four times. By the above-described process, word lines 7a, 7b are formed. In the meantime, the word lines keeping semiconductor pillar 2 therebetween constitute one set and each set of word lines performs an operation. Word lines 7a, 7b isolated by protective film 10 belong to the different sets, respectively.

Next, as shown in FIG. 14, a silicon oxide film is grown as interlayer film 11 by the CVD method. The grown interlayer film is abrasively removed by the CMP method to expose mask nitride film 21 and is filled in recessed trench 7T for word line formation.

As shown in FIG. 15, mask nitride film 21 is removed to expose surfaces 2s of silicon pillars 2. The exposed portions are referred to as silicon pillar openings.

Figure 16A:
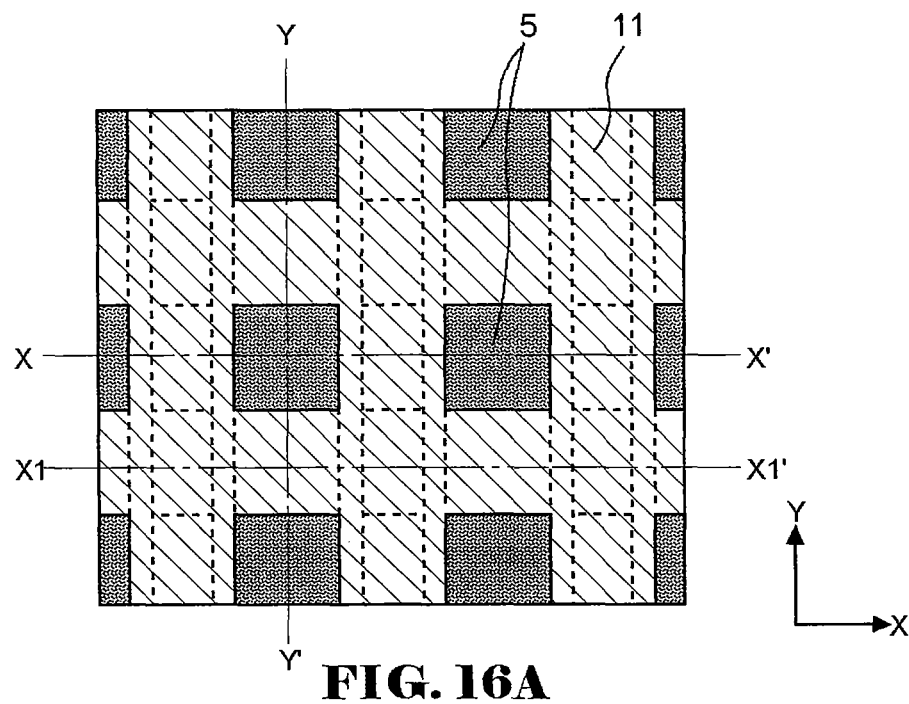
Figure 16D:
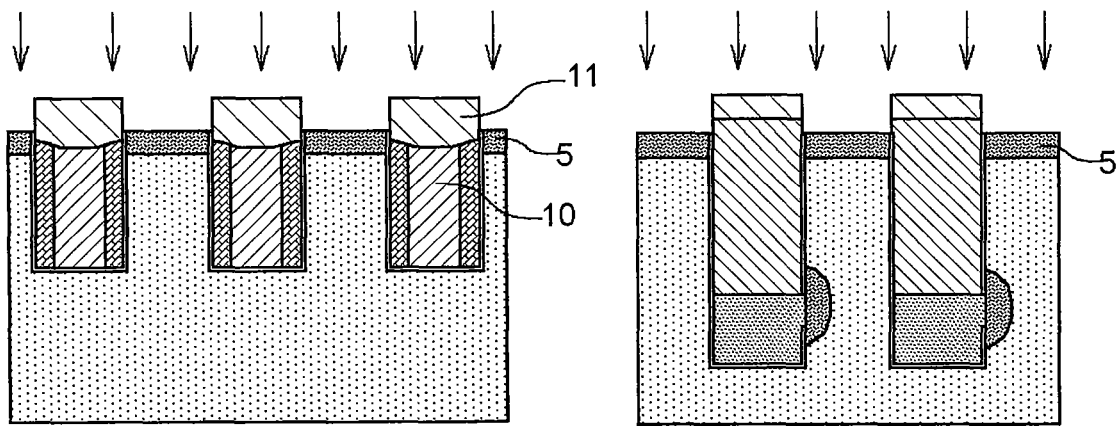
Figure 16D:
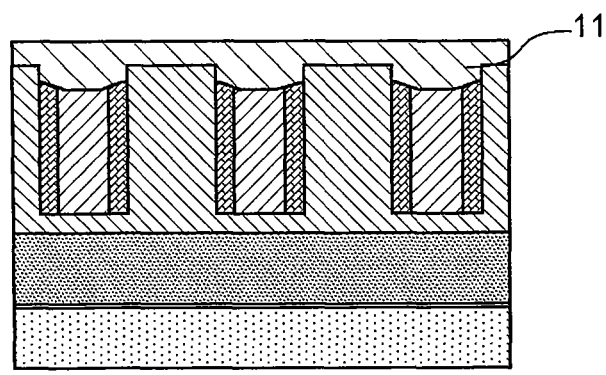

As shown in FIG. 16, impurities are implanted into the upper portions of the silicon pillars to form N-type impurity diffusion layers 5. The implantation was performed by ion-implanting arsenic with the energy of 30 KeV and the dose of $1 \times 10^{15}$ atoms/cm$^2$.

As shown in FIG. 17, contact plugs 12 are formed to fill up the silicon pillar openings. As the material of the contact plugs, a phosphorous-doped silicon film was used. However, the invention is not limited to the material. For example, an arsenic-doped silicon film, a stacked film of a titanium film, a titanium nitride film and a tungsten film and the like can be used. The film is formed to fill up the openings of the upper surfaces of the silicon pillars.

The contact plug material is abrasively removed by the CMP method to expose the upper surface of the interlayer film. For doing so, an etching-back using a dry etching technique can be performed in stead of the CMP method.

Next, cylindrical capacitors including lower electrodes 13 connected to contact plugs 12, dielectric film 14 and upper electrodes 15 are formed, as shown in FIG. 2. Furthermore, interlayer insulating films 16, 17 are formed on upper electrodes 15. Contacts (not shown), which pass through the capacitor interlayer film and are electrically connected to word lines 7a, 7b and bit lines, are respectively formed on interlayer insulating film 16. Interconnections (not shown), which are connected to the respective contacts, are formed. Interlayer insulating film 17 is formed on the interconnections.

Through the above-described processes, a DRAM is formed which has memory cell transistors having a pillar-type MOS structure, bit lines connected to source/drain formed at the lower portion of the pillar-type MOS and capacitors connected to the source/drain formed at the upper portion of the pillar-type MOS.

In the process of FIG. 12, when the etching is progressed until the depression of the protective film becomes flat, it is not possible to make the recessed amount of the gate electrode greater than the corresponding recessed amount. However, in a modified example of this exemplary embodiment, a method of making the recessed amount of the gate electrode deeper is disclosed. FIGS. 18 and 19 are sectional views showing X-X' sections corresponding to FIG. 12B.

After the process of FIG. 12, the etching is performed using chlorine gas. By etching the titanium nitride film using the chlorine-based gas, the chemical etching acts, so that the height of the titanium nitride film can be lowered to a recessed amount h17. An example of the etching conditions is as follows.

Gas: $Cl_2$, 140 sccm
Bias power: 0 W
Source power: 1200 W
Pressure: 1.33 Pa (10 mTorr)

When it is desired to further increase the recessed amount, a further etching is performed under same conditions after the process of FIG. 18. It is possible to lower the height to a recessed amount h18 that is lower than the upper surface of the first protective film. In the meantime, the silicon oxide film such as first protective film 10 or gate insulating film 6 is little etched.

The processes after this process are the same as those after the process of FIG. 14.

The etching using chlorine-based gas has a high chemical etching action. Thus, when reaction products and the like exist on the titanium nitride film, the etching is apt to be inhibited, so that non-uniformity in the recessed amounts may be caused. In this case, a surface is cleaned and then the etching is performed.

In this exemplary embodiment, the silicon substrate is provided with the trenches to form the silicon pillars. The gate insulating film and the titanium nitride film that is the gate electrode film are sequentially formed on the sidewalls of the silicon pillars. Then, the protective film made of silicon oxide film is filled in the trenches. Subsequently, the protective film is etched back, so that the surface of the protective film is recessed to a desired depth. When or after performing the etching-back for protective film, the exposed titanium nitride film is removed by etching, so that the gate electrodes are formed. The impurity diffusion layers having a conduction type oppose to the silicon pillars are provided at the upper and lower portions of the silicon pillars, so that the vertical MOS transistors are obtained. Since the surface of the titanium nitride film is covered by the protective film in performing the etching-back of the protective film and the etching of the titanium nitride film, it is possible to prevent the surface of the titanium nitride film from etching-damage and to suppress the non-uniformity of the depths of the upper ends of the titanium nitride film.

In addition, the protective film provided in the trenches is formed with the depressions to form an angle at the protective film surface relative to the horizontal surface, and is etched back by the dry etching method, so that the angle of the protective film surface to the horizontal surfaces in the depression is smaller. When the shape of the depression is changed into the U shape, the etching is ended, so that it is possible to reduce the non-uniformity of the recess depths of the protective film. According to the conventional etching-back technique, the shape of a film surface is typically constant before and after the etching-back. In addition, in order to flatten the film surface after the etching-back, the film surface is first flattened and the etching-back is then performed.

By combining the above, it is possible to provide a method of manufacturing a semiconductor device more suitable.

Exemplary Embodiment 2

In the followings, a process of manufacturing a semiconductor device according to a second exemplary embodiment will be described.

FIGS. 20 to 31 show processes of manufacturing a semiconductor device according to a second exemplary embodiment. FIGS. 20 to 31 are sectional views corresponding to the Y-Y' sections in FIG. 2A.

Herein, an example will be described in which the invention is applied to a process of forming openings w29 connecting bit lines 3 and N-type impurity diffusion layers 4 formed in silicon pillars 2, which are shown in FIGS. 2A to 2C.

Figure 20:
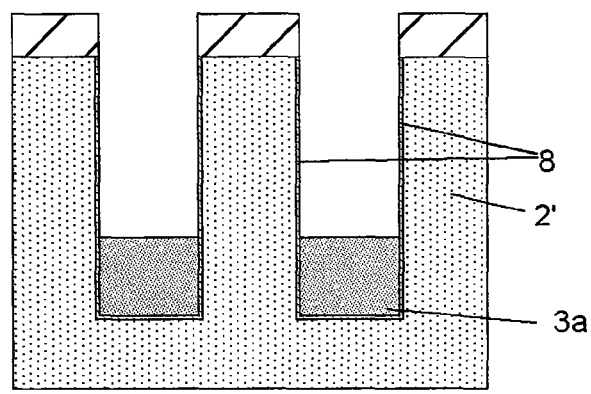

After forming trenches 3T for bit line formation as shown in FIG. 3, insulating film 8, which covers the sidewalls of silicon fins 2' and bottom surfaces of trenches for bit line formation and is made of a silicon oxide film, is formed, as shown in FIG. 20. A conductive material film is formed so as to the trenches for bit line formation. The material of the film is a phosphorous-doped silicon film, for example.

The conductive material film is etched back to form conductive material film 3a having a height of about 100 nm from the bottom surfaces of the trenches for bit line formation. Conductive material film 3a is extended in the X direction when seen from a plan view.

Figure 21:
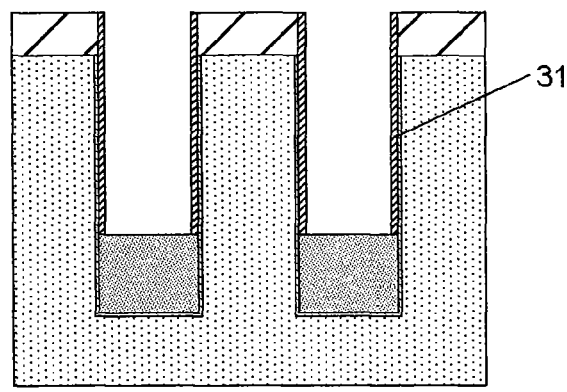

Next, as shown in FIG. 21, a silicon nitride film is formed so as to cover conductive material film 3a, insulating film 8 and the mask insulating film and is then etched back, so that spacers 31 are formed on insulating film 8 on the sidewalls of the trenches for bit line formation. The upper surface of conductive material film 3a is exposed.

Figure 22:
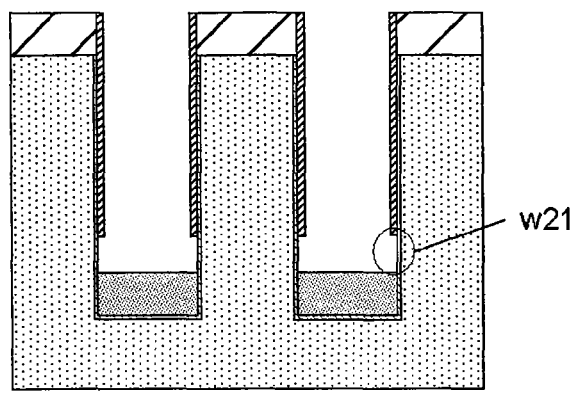

Next, as shown in FIG. 22, conductive material film 3a is etched back to recess a height from the bottom of the trench for bit line formation to about 50 nm. Through the etching-back, parts of conductive material film 3a below spacers 31 are removed and insulating film 8 is exposed, so that side openings w21 are formed in spacers 31.

Figure 23:
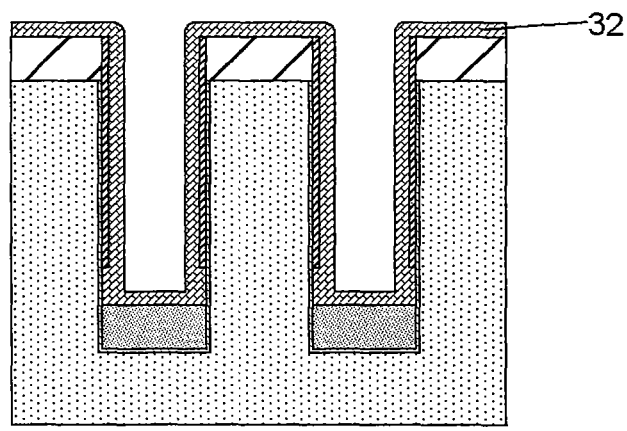

Next, as shown in FIG. 23, film 32 is formed. A titanium nitride film was used as the material of the film. The film was formed to have a thickness of about 20 nm by the CVD method.

Figure 8D:
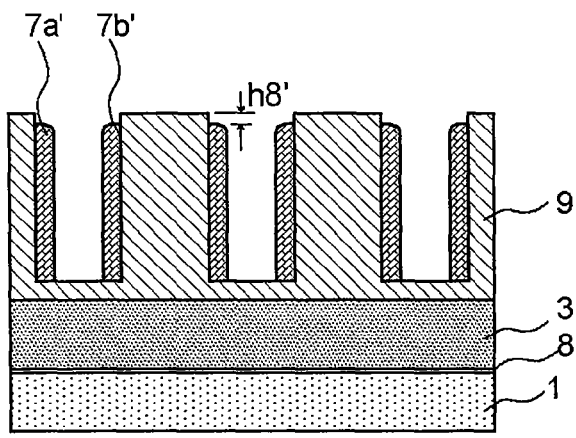
Figure 24:
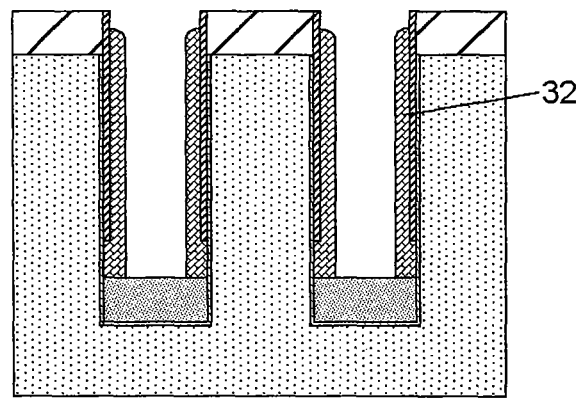

Next, as shown in FIG. 24, similar to the process of FIG. 8 in the exemplary embodiment 1, film 32 is etched back to form spacers 32.

Figure 25:
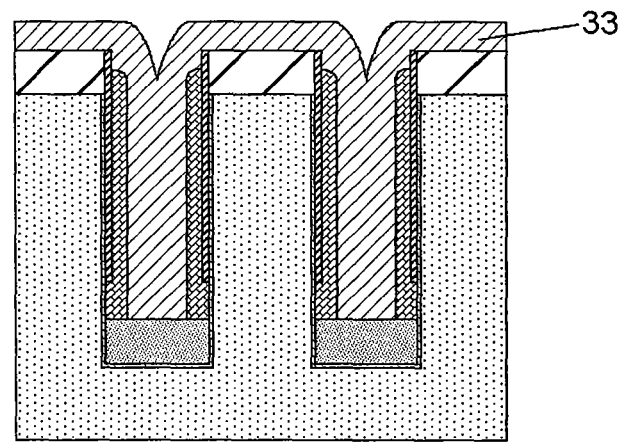

Next, as shown in FIG. 25, similar to protective film 10 in the process of FIG. 8 in the exemplary embodiment 1, protective film 33 is formed.

Figure 26:
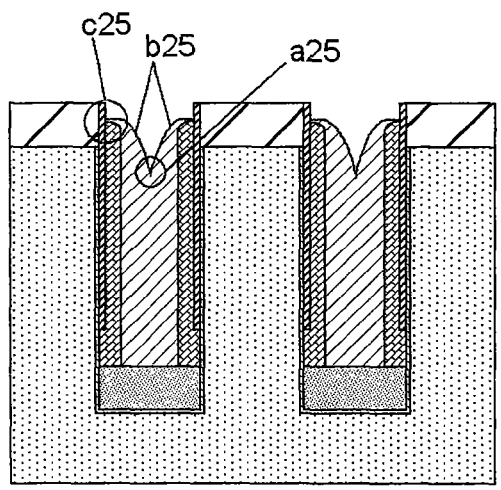

Next, as shown in FIG. 26, similar to the process of FIG. 10 in the exemplary embodiment 1, the first etching-back for protective film is performed for protective film 33.

Figure 27:
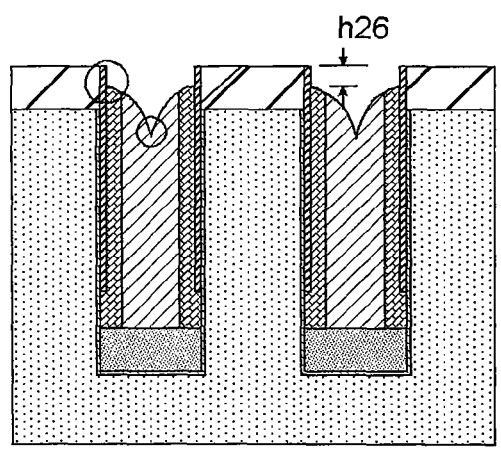
Figure 28:
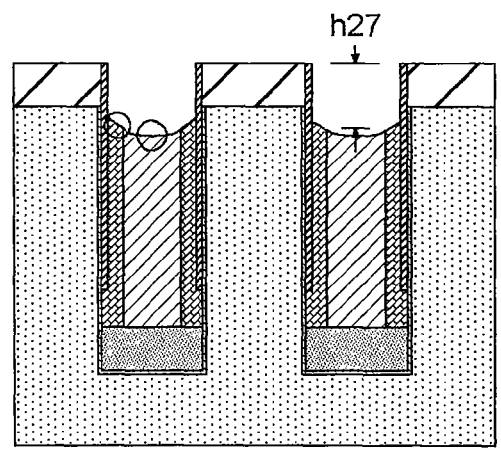

As shown in FIGS. 27 to 28, similar to the processes of FIGS. 11 to 12 in the exemplary embodiment 1, the second etching-back for protective film is performed. As described in the process of FIG. 12 in the exemplary embodiment 1, when the invention is used, it is possible to form spacers 32 having recessed amounts h27 whose heights in a chip and in a wafer surface are uniform. In addition, it is possible to fill up with protective film 33 between two spacers 32 formed on both sidewalls between the trenches for bit line formation.

Figure 29:
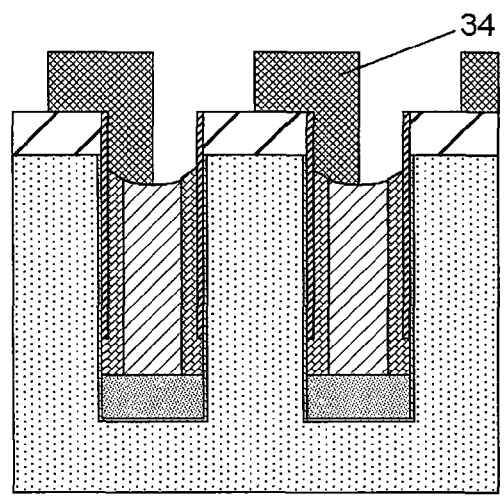

Next, as shown in FIG. 29, mask film 34 is formed on each one of spacers 32 opposite to each other in the trenches for bit line formation, which covers from the upper surface of mask nitride film 21 to a half of the upper surface of protective film 33 in the trenches for bit line formation and is extended in the Y direction when seen from a plan view. That is, at least part of the upper surface of one of two spacers 32 formed on both sidewalls in the section for bit line formation is not covered with mask film 34. Herein, openings are provided in mask film 34 so that the upper surface of the spacer 32 on the side surface of silicon fin 2', which is left as silicon pillar 2 formed in the process of FIG. 7 in the exemplary embodiment 1, is partially or wholly exposed.

In the process of FIG. 28, since the recessed amounts h27 are uniform in a chip and in a wafer surface, it is possible to easily form the mask film that opens a half of the inside of the trenches for bit line formation.

Figure 30:
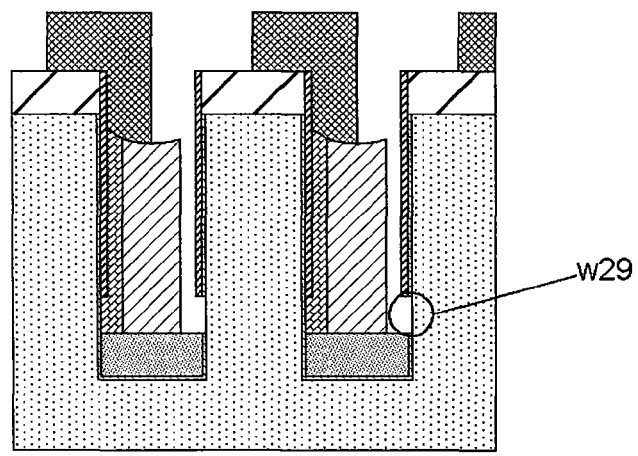

Next, as shown in FIG. 30, spacers 32 having the upper surfaces exposed are selectively removed by etching with using the mask film, so that insulating film 8 is exposed to side openings w21. Continuously, insulating film 8 exposed to side openings w21 is selectively removed to form side openings w29 exposing the silicon fins.

Figure 31:
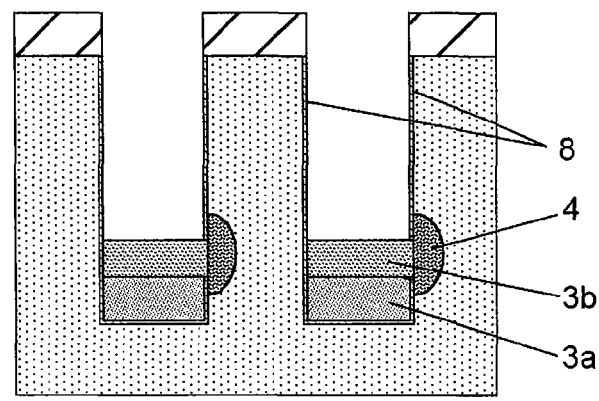

Next, as shown in FIG. 31, mask film 34, protective film 33 and spacers 32 are removed. A conductive material film is formed so as to fill up the trenches for bit line formation. The conductive material film is etched back to form conductive material film 3b having a thickness of about 50 nm on conductive material film 3a. Conductive material film 3b is connected to side surfaces of the silicon fins via side openings w29. The material of conductive material film 3b is a phosphorous-doped silicon film, for example. The phosphorous impurities are diffused from conductive material film 3b, thereby forming N-type impurity diffusion layers 4. After this process, the same processes as those after the process of FIG. 5 in the exemplary embodiment 1 are performed to complete a DRAM chip.

In this exemplary embodiment, the silicon substrate is provided with the trenches to form the silicon fins. The silicon oxide film, the silicon nitride film and the titanium nitride film are sequentially formed on the sidewalls of the trenches. At this time, the silicon oxide film and the titanium nitride film are connected to each other via the openings provided to the silicon nitride film. Then, the protective film made of the silicon oxide film is filled in the trenches. Subsequently, the protective film is etched back, so that the surface of the protective film is recessed to a desired depth. When or after performing the etching-back for protective film, the exposed titanium nitride film is removed by etching. Furthermore, a part of the titanium nitride film is selectively removed to remove the silicon oxide film exposed from the openings. As a result, parts of the sidewalls of the silicon fins are exposed. Since the surface of the titanium nitride film is covered by the protective film in performing the etching-back and etching the titanium nitride film, it is possible to prevent the surface of the titanium nitride film from etching-damage and to suppress the non-uniformity of the depths of the upper ends of the titanium nitride film.

In addition, the protective film provided in the trenches is formed with the depressions to form an angle at the protective film surface relative to the horizontal surface, and is etched back by the dry etching method, so that the angle of the protective film surface to the horizontal surfaces in the depression is smaller. When the shape of the depression is changed into the U shape, the etching is ended, so that it is possible to reduce the non-uniformity of the recessed depths of the protective film.

By combining the above, it is possible to provide a method of manufacturing a semiconductor device more suitable.

In each exemplary embodiment, the example has been specifically described in which the invention is applied to the process of forming word lines and the process of forming bit contacts in the DRAM manufacturing process. However, the invention is not limited thereto. For example, regarding a process of manufacturing a semiconductor device, the invention can be applied when setting a recess of a surface of material, which is filled in a trench provided to a surface of a semiconductor substrate, to a predetermined depth.

The invention claimed is:

1. A method of manufacturing a semiconductor device comprising:

forming a first layer on a sidewall of a trench formed on a main surface of a semiconductor substrate;

filling up the trench with a protective film; and etching back the protective film by a dry etching method so that a height of a surface of the protective film is lower than an opening of the trench and a portion of the first layer is exposed, and removing the exposed portion of the first layer, wherein the etching-back is performed under conditions that an etching rate for an inclined portion of the protective film is higher than an etching rate for a flat portion of the protective film.

2. The method according to claim 1, wherein a depression having a slope of an angle θ1 to a horizontal surface is provided to a surface of the protective film in the trench before the etching-back and an angle θ2 of the slope of the depression to the horizontal surface after the etching-back is smaller than the angle θ1.

3. The method according to claim 1, wherein the etching-back is performed using etching gas including $BCl_3$.

4. The method according to claim 1, wherein a plurality of first trenches extending to a first direction and a plurality of second trenches extending to a second direction which differs from the first direction are formed as said trench to provide a plurality of semiconductor pillars, and said first layer is a gate electrode film formed on side faces of the plurality of semiconductor pillars via a gate insulating film; and wherein the method further comprises forming impurity diffusion layers having a conduction type opposite to the plurality of silicon pillars at the upper and lower portions of the plurality of silicon pillars, respectively to provide a vertical transistor.

5. A method of manufacturing a semiconductor device comprising:

providing a trench on a main surface of a semiconductor substrate and forming first and second semiconductor regions isolated at least by the trench and being adjacent to each other;

sequentially depositing an insulating film, a first layer and a second layer on side faces of the first and second semiconductor regions in the trench;

filling up the trench with a protective film; and etching back the protective film to expose a portion of the second layer and removing the exposed portion of the second layer, wherein the insulating film and the second layer are connected to each other via an opening provided to the first layer, and further comprising:

after removing the exposed portion of the second layer, further selectively removing the second layer using a mask having an opening exposing at least a part of a surface of the second layer of one of the first and second semiconductor regions, exposing the first layer and the insulating film to the opening of the first layer and removing the exposed insulating film to expose a side surface of one of the first and second semiconductor regions, wherein the etching-back is performed under conditions that an etching rate for an inclined portion of the protective film is higher than an etching rate for a flat portion of the protective film.

6. The method according to claim 5, wherein a depression having a slope of an angle θ1 to a horizontal surface is provided to a surface of the protective film in the trench before the etching-back and an angle θ2 of the slope of the depression to the horizontal surface after the etching-back is smaller than the angle θ1.

7. The method according to claim 5, wherein the etching-back is performed using etching gas including $BCl_3$.

8. A method of manufacturing a semiconductor device comprising:
   filling up a trench formed on a main surface of a semiconductor substrate with a first layer; and
   etching back the first layer by a dry etching method so that an upper end of the first layer in the trench is lower than a height of an opening edge of the trench by a predetermined value,
   wherein the etching-back is performed under conditions wherein an etching rate for an inclined portion of the first layer is higher than an etching rate for a flat portion.

9. The method according to claim 8, wherein the etching-back is performed using etching gas including $BCl_3$.

10. The method according to claim 8, wherein a depression having a slope of an angle θ1 to a horizontal surface is provided to a surface of the first layer in the trench before the etching-back and an angle θ2 of the slope of the depression to the horizontal surface after the etching-back is smaller than the angle θ1.

11. The method according to claim 1, wherein the protective film is formed to a thickness in a range equal to or greater than a half of a width of the trench and less than said width of the trench, and a depression is provided on a surface of the protective film.

12. The method according to claim 5, wherein the protective film is formed to a thickness in a range equal to or greater than a half of a width of the trench and less than said width of the trench, and a depression is provided on a surface of the protective film.

13. The method according to claim 8, wherein the protective film is formed to a thickness in a range equal to or greater than a half of a width of the trench and less than said width of the trench, and a depression is provided on a surface of the protective film.

14. The method according to claim 1, further comprising:
   etching the first layer using etching gas including material that is not included in etching gas that is used in the etching-back.

* * * * *